(12) United States Patent
Masuda et al.

(10) Patent No.: US 8,174,116 B2
(45) Date of Patent: May 8, 2012

(54) SPACER, AND ITS MANUFACTURING METHOD

(75) Inventors: Koichiro Masuda, Minato-ku (JP);
Tooru Mori, Minato-ku (JP)

(73) Assignee: NEC Corporation, Tokyo (JP)

( * ) Notice: Subject to any disclaimer, the term of this patent is extended or adjusted under 35 U.S.C. 154(b) by 207 days.

(21) Appl. No.: 12/674,761

(22) PCT Filed: Aug. 25, 2008

(86) PCT No.: PCT/JP2008/065117
§ 371 (c)(1),
(2), (4) Date: Feb. 23, 2010

(87) PCT Pub. No.: WO2009/028463
PCT Pub. Date: Mar. 5, 2009

(65) Prior Publication Data
US 2011/0127680 A1 Jun. 2, 2011

(30) Foreign Application Priority Data

Aug. 24, 2007 (JP) ................................. 2007-218546
Oct. 10, 2007 (JP) ................................. 2007-264835

(51) Int. Cl.
*H01L 23/34* (2006.01)
(52) U.S. Cl. ................. 257/724; 257/E21.008; 257/717; 438/107; 361/760; 361/770

(58) Field of Classification Search ........... 257/E21.477, 257/E21.008, E23.141, 717, 719, 720, 724, 257/730, 779; 438/107, 109, 110, 381; 174/260; 228/33; 427/290; 361/760, 770, 782, 783, 361/803
See application file for complete search history.

(56) References Cited

U.S. PATENT DOCUMENTS 6,884,939 B2 * 4/2005 Dishongh et al. ............. 174/534
(Continued)

FOREIGN PATENT DOCUMENTS

JP 63-157919 A 10/1988
(Continued)

*Primary Examiner* — Chris Chu
(74) *Attorney, Agent, or Firm* — Sughrue Mion, PLLC

(57) ABSTRACT

Provided are a spacer capable of avoiding a poor connection due to the suction of solder when the clearance width between a soldered semiconductor device and a printed circuit board is made constant, and a manufacturing method for the spacer. The spacer includes an electrically insulating base member, and at least one solder guiding terminal. The base member has a bottom face, a top face and at least one side face, of which the bottom face and the top face are out of contact with each other whereas the side face contacts one or both the bottom face and the top face. The solder guiding terminal covers the bottom face partially, the top face partially, and the side face partially or wholly. A solder guiding face as the surface of a portion of the solder guiding terminal covering the side face is not normal to the bottom face.

11 Claims, 66 Drawing Sheets

U.S. PATENT DOCUMENTS

| | | | |
|---|---|---|---|
| 7,023,085 B2 * | 4/2006 | Pu | 257/724 |
| 7,166,917 B2 * | 1/2007 | Yang et al. | 257/724 |
| 7,622,325 B2 * | 11/2009 | Shim et al. | 438/106 |
| 7,791,192 B1 * | 9/2010 | Joshi et al. | 257/724 |
| 8,084,297 B1 * | 12/2011 | Joshi et al. | 438/106 |
| 2002/0117748 A1 * | 8/2002 | Avery et al. | 257/723 |
| 2002/0140085 A1 * | 10/2002 | Lee et al. | 257/724 |
| 2003/0218235 A1 * | 11/2003 | Searls et al. | 257/532 |
| 2004/0067605 A1 * | 4/2004 | Koizumi | 438/108 |
| 2005/0051892 A1 * | 3/2005 | Andoh | 257/724 |
| 2006/0158863 A1 * | 7/2006 | Hsu | 361/760 |

FOREIGN PATENT DOCUMENTS

| | | |
|---|---|---|
| JP | 08-316268 A | 11/1996 |
| JP | 10-125508 A | 5/1998 |
| JP | 2002-270645 A | 9/2002 |
| JP | 2004-273475 A | 9/2004 |

* cited by examiner

SPACER, AND ITS MANUFACTURING METHOD

TECHNICAL FIELD

The present invention relates to a spacer used for keeping the clearance width between soldering targets to be uniform when soldering and connecting a mounting board to an electronic component, such as a printed circuit board to a printed circuit board, a printed circuit board to a semiconductor circuit, and a printed circuit board to various devices, and also relates to a manufacturing method of the same.

BACKGROUND ART

In accordance with recent developments in technologies, power supply terminals and signal terminals in LSI (Large Scale Integrated Circuit) have been developed into multi-terminals due to the increasing information amount handled therewith and the tendency of having low voltage and high power. Methods for connecting LSI having several tens to several hundreds of terminals to a target board (printed circuit board, interposer, etc.) may be soldering using solder or the like, and adhesion using a conductive binder.

With such connecting methods, when the width of the clearance between the connected LSI and the target board becomes nonuniform, load is concentrated onto a part of the connected area. This may result in having a poor connection state, so that it is necessary to level the width of the clearance between the soldered LSI and the target board. This will be described in a specific manner by referring to drawings.

FIG. 62 shows a schematic sectional view of a state where the clearance between the LSI and the target board is nonuniform. An LSI 300 shown in FIG. 62 includes an interposer 310, a semiconductor circuit chip 330, and LSI pads 320 used for connection. A printed circuit board 400 as the target board includes PWB pads 420 used for connection. Wirings of the interposer 310 and the wirings of the printed circuit board 400 are omitted in the drawings.

If the LSI 300 is tilted when mounting the LSI 300 to the printed circuit board 400, a section 901 having a large clearance width with respect to the printed circuit board 400 and a section 902 having a small clearance width are generated. Thus, solder 501 which is supposed to connect the LSI pads 320 to the PWB pads 420 is separated from one of the pads in the section 901 having the large clearance width, thereby causing a poor connection state 903.

In order to avoid such poor connection state, Patent Document 1 discloses a technique which prevents the clearance width between the target board and the electronic component from becoming nonuniform.

FIG. 63 shows a side view as well as a bottom view of a semiconductor device 4 depicted in Patent Document 1, and a side view when it is mounted to a device board. The technique disclosed in Patent Document 1 makes the width of the clearance between the semiconductor device 4 and the device board 2 by supporting the semiconductor device 4 and the device board 2 by a spacer 42.

However, with the technique disclosed in Patent Document 1, the spacer 42 is provided in the outer fringe part of the semiconductor device 4. For that, the external size of the semiconductor device 4 is expanded more than it is necessary, thereby increasing the occupying area. Further, since the spacer 42 is unified with the semiconductor device 4, there is no versatility in the clearance width between the semiconductor device 4 and the device board 2 when mounting the semiconductor device 4. Thus, the soldering condition such as the size of solder balls 15 cannot be changed easily.

Patent Document 2 therefore discloses a technique which overcomes the inconveniences of the technique disclosed in Patent Document 1, and Patent Document 3 discloses a capacitor that is suited for an electronic component depicted in Patent Document 2.

FIG. 64 shows a bottom view and a side view of the semiconductor device depicted in Patent Document 2. With the technique disclosed in Patent Document 2, electronic components 54 are attached in advance between solder balls 53 provided on the bottom face of a base board 52 so as to support the base board 52 and a mother board with the electronic components 54 when mounting the base board 52 to the mother board to have a uniform width of the clearance between the base board 52 and the mother board. With this structure, the size of the base board 52 can be remained in a normal size.

FIG. 65 shows a perspective view and a sectional view of the capacitor depicted in Patent Document 3. The capacitor shown in FIG. 65 is formed in a structure in which electrodes 61, 62, 63, and 64 are disposed at four corners or the like. It is possible to have a capacitance between terminals of the base board 52 by using such capacitor as the electronic component 54 depicted in Patent Document 2 to connect the electrodes 61, 62, 63, and 64 with solder.

Patent Document 1: Japanese Unexamined Patent Publication H8-316268 (FIG. 1)

Patent Document 2: Japanese Unexamined Patent Publication 2004-273475 (FIG. 1)

Patent Document 3: Japanese Unexamined Utility Model Publication S63-157919 (FIG. 1 and FIG. 2)

DISCLOSURE OF THE INVENTION

Problems to be Solved by the Invention

However, the inventors of the present invention have eagerly investigated the related technique disclosed in Patent Document 2, and found that this technique has some issues as well.

In the semiconductor device disclosed in Patent Document 2, the electronic component 54 functioning as a spacer is close to the solder ball 53. This may cause a poor connection state because the melted solder is drawn to the side face of the electronic component 54. This is the same when the capacitor disclosed in Patent Document 3 is used as the electronic component 54.

In order to explain the occurrence of the poor connection state, FIG. 66 shows a sectional view of a case where an electronic component is mounted to an LSI. An LSI 300 shown in FIG. 66 includes an interposer 310 and a printed circuit board 400. The interposer 310 includes LSI pads 320, 321, and 322. The printed circuit board 400 includes a PWB resin 410, and PWB pads 420, 421, and 422. An electronic component 600 is disposed between the interposer 310 and the printed circuit board 400, and those are connected by solders 501, 502, and 503.

In FIG. 66, an electrode 622 of the electronic component 600 draws the solder 501. Therefore, the solder supposed to be connected to the LSI pad 320 becomes insufficient, and the solder 510 supposed to connect the LSI pad 320 and the PWB pad 420 is detached from the LSI pad 320. This is a phenomenon generated due to the wettability, the surface tension, and the like of the solder when the solder is melted. Even though the electrode 621 of the electronic component 600 draws the solder 502 as well, the LSI pad 321 and the PWB pad 421 are connected by the solder 502 since the amount of the solder is sufficient.

It is therefore an object of the present invention to overcome the issues of the above-described related techniques, and to provide a spacer as well as a manufacturing method thereof, which can suppress a poor connection state between two components caused due to drawing of the solder while keeping the clearance between the both components connected by solder to be in a uniform width.

Disclosure of the Invention

The spacer of the present invention is a spacer placed in a clearance to keep width of the clearance between a mounting board and an electronic component when soldering a pad of the mounting board and a pad of the electronic component mounted on the board by using a predetermined amount of solder. The spacer including a solder guiding face for being connected to the solder used for the soldering, and the solder guiding face is in a shape in which one end is protruded towards an outer side than the other end.

The spacer manufacturing method of the present invention is a spacer manufacturing method, which includes: forming a through-hole whose one aperture area is different from the other aperture area on a base member; coating a metal terminal on an inside surface of the hole; and cutting the base member by dividing the hole.

Effect of the Invention

The present invention makes it possible to provide the spacer and the manufacturing method thereof, which can effectively prevent the poor connection state between the solder and the pads by pushing up the solder used for soldering with the solder guiding face to guide it towards the upper side when soldering the pads of the mounting board and the pads of the electronic component.

BEST MODES FOR CARRYING OUT THE INVENTION

Hereinafter, preferable modes for embodying a spacer and a manufacturing method according to the present invention will be described in detail by referring to the accompanying drawings. In each drawing, each part may be illustrated in different scales from actual ones in some cases for simplifying the explanations of each part. For example, even though the thickness of metal terminals is normally 1 μtm or less, it is drawn in the thickness to be recognizable in the drawings.

The space of the exemplary embodiment is a spacer having an electric insulating base member and at least one solder guiding terminal. The surface of the base member is formed with a bottom face, a top face, and at least one side face. The bottom face and the top face do not come in contact with each other, and the side face is a face which is in contact with one of or both of the bottom face and the top face. The solder guiding terminal covers a part of the bottom face, a part of the top face, and a part of or a whole part of the side face, and a solder guiding face that is the surface part covering the side face of the solder guiding terminal is non-perpendicular with respect to the bottom face.

FIG. 1 is a schematic perspective view showing a spacer 100 of a first exemplary embodiment of the invention. FIG. 2 is a schematic end view taken along the line A-A of FIG. 1. FIG. 3-FIG. 7 are illustrations showing a use example of the spacer 100 of the exemplary embodiment shown in FIG. 1, which illustrate a case where the spacer 100 is loaded between the LSI 300 and the printed circuit board 400.

FIG. 3 is a schematic perspective view showing a state before the LSI 300 is mounted to the printed circuit board 400. FIG. 4 is a schematic end view taken along the line B-B of FIG. 3. FIG. 5 is a schematic perspective view showing a state where the LSI 300 is mounted to the printed circuit board 400. FIG. 6 is a schematic end view taken along the line C-C of FIG. 5. FIG. 7 is a schematic enlarged end view showing a state after soldering an area D of FIG. 6.

The spacer 100 is formed with an electrically insulating base member 150 and four solder guiding terminals 120. The base member 150 is silicon covered by an oxide film. However, the base member 150 is not specifically limited to that, as long as it is of an electrically insulating characteristic. For the solder guiding terminal 120, a plane shape is provided at four corners of the almost square base member 150. However, the exemplary embodiment is not limited only to such case. It is necessary to have at least one solder guiding terminal 120.

The surface of the base member 150 is formed with a top face 161, a bottom face 162, and side faces other than those. There are four side faces which correspond to four sides of the top face 161 or the bottom face 162, and four faces covered by the solder guiding terminal 120, which correspond to the four corners of the top face 161 or the bottom face 162.

The bottom face 162 and the top face 161 are the faces which do not cross with each other, and the side faces are the faces which cross with both the bottom face 162 and the top face 161.

The solder guiding terminal 120 covers over an area from a part of the side face of the base member 150 to a part of the bottom face 162 and a part of the top face 161. Provided that the surface of the solder guiding terminal 120 corresponding to the side face is a solder guiding face 110, the solder guiding face 110 is non-perpendicular to the bottom face 162. Preferably, the angle between the both is an acute angle.

As shown in FIG. 7, by being disposed between the LSI 300 and the printed circuit board 400 connected by soldering, the spacer 100 has a basic function of placing the LSI 300 in parallel to the printed circuit board 400 so as to prevent soldering failure caused when the LSI 300 becomes tilted.

The solder guiding terminal 120 has a function of guiding the solder and the like by the shape of the solder guiding face 110. While the surface of the solder guiding terminal 120 is gold-plated for increasing the solder guiding property, it is not specifically limited to the gold-plating as long as it provides a function of guiding the solder. For example, in a case where solder is used for soldering, another metal surface processing such as tin plating may be applied. The surface of the solder guiding terminal 120 to which the surface processing is applied exhibits high solder wettability, so that the solder can be attached thereto in a fine manner. Thus, the solder moves up along the surface of the solder guiding terminal 120. When a conductive adhesive is used as the solder, the material of the solder guiding terminal 120 is not limited to those to which the metal surface processing is applied. For example, various plastics, various ceramics, and the like can be used preferably.

When the melted solder is guided due to the surface tension by the solder guiding terminal 120 at the time of soldering and the solder is set thereafter in accordance with a decrease in the temperature, each of the parts is fixed in a unified manner. Even when a conductive adhesive is used as the solder, the solder guiding terminal 120 has a function of guiding the conductive adhesive upwards by its shape.

The use example of the spacer 100 shown in FIG. 3-FIG. 7 shows the case of disposing four spacers 100 and of soldering the LSI 300 with thirty-six solder balls 510, when mounting the LSI 300 by using the solder balls 510 on the printed circuit board 400 where the electronic components 601, 602, 603, and 604 are mounted. In this use example, the LSI 300 is formed by mounting a semiconductor circuit chip 330 on the interposer 310. However, the LSI 300 is not limited only to such case. A resin-molded LSI may be used as well.

As shown in FIG. 4, on the printed circuit board 400, a resist 440 for insulation is applied on the surface of the PWB resin 410 so as to prevent short-circuit with the internal electric circuit of the printed circuit board 400. The solder balls 510 are disposed on the PWB pads 420 of the printed circuit board 400.

The solder guiding face 110 of the solder guiding terminal 120 is non-perpendicular to the bottom face 162 of the spacer 100, and the angle formed therebetween is preferably an acute angle. With this, when heat is applied in a state where the solder guiding face 110 and the solder ball 510 are in contact, the solder 501 is not easily flown downwards along the solder guiding face 110 since the space for the solder 501 generated from the melted solder ball 510 to flow downwards is small (see FIG. 7). In other words, through making the solder guiding face 110 non-perpendicular to the bottom face 162 and making the occupied volume of the solder guiding terminal 120 on the bottom face side large, flow-down of the melted solder 510 to the lower side can be prevented, and the solder 501 is guided upwards. As a result, the solder 501 is drawn to the lower part of the solder guiding face 110. Thus, there is no shortage of the solder occurred on the upper section of the solder guiding face 110, so that it is possible to achieve secure connection of the LSI pad 320 and the solder 501.

Like the solder 501, the solder 502 shown in FIG. 7 connects the PWB pad 421, the LSI pad 321, and the solder guiding terminal 120. The solder 503 connects the PWB pad 422 and the LSI pad 322.

Further, as shown in FIG. 3, the spacer 100 is formed to be disposed between a plurality of solder balls 510, and it is not disposed on the outer fringe part of the LSI 300. Thus, the external size of the LSI 300 is not expanded. Furthermore, the spacer 100 is not unified with the LSI 300, which allows more versatility when mounting the LSI 300. This makes it possible to change the soldering condition of the solder balls 510 and the like easily. This is because the solder guiding terminal 120 is fixed to the PWB pads 420 and 421 with the set solders 501 and 502 by soldering, so that it is not necessary to tightly glue the spacer 100 to the printed circuit board 400 in advance.

As shown in FIG. 1, it is one of the preferable forms of the spacer 100 to have the solder guiding face 110 of a curved face. Especially, it is one of the preferable forms to be in a concave face. Such shape makes it possible to have a large contact area between a ball-type solder and the solder guiding face 110 in a case of using the ball-type solders (e.g., solder balls 510), so that the flow-down amount of the solder when the solder is melted can be suppressed. This results in preventing a poor connection state. In particular, it is preferable for the solder guiding face 110 to have a shorter arc on the top face side than an arc on the bottom face side in order to effectively prevent the poor solder connection state for the connection pad located on the upper side.

Note here that "the solder guiding face 110 is a concave face" means that it is in a shape in which an intersection line from the solder guiding face 110 to an arbitrary face that is perpendicular to the bottom face 162 forms a convex line towards the bottom face side. The radius curvature of the concave face of the solder guiding face 110 is set slightly larger than the radius of the solder ball 510. Thus, a relatively large area of the surface of the solder ball 510 comes to be almost in contact with the surface of the solder guiding face 110.

In a state where the LSI 300 is placed at a prescribed position of the printed circuit board 400 as in FIG. 5 and FIG. 6, the solder balls 510 keep almost the original form even though they are being slightly squashed, since those are in a state before reflow.

After the reflow, as shown in FIG. 7, the melted solder 501 connects the PWB pad 420, the LSI pad 320, and the solder guiding terminal 120, and it is set in that state. This is because the flow-down amount of the solder when the solder is melted is small and the solder 501 creeps up the surface of the solder guiding terminal 120 since the solder guiding face 110 almost corresponds and meets with the bottom face shape of the solder ball 510. Thereby, a sufficient amount of solder can be secured for connecting to the LSI pad 320 on the upper side, thereby making it possible to effectively prevent a poor connection state between the LSI pad 320 and the PWB pad 420.

The length of a fringe 130 of the top face side of the solder guiding face 110 is longer than the length of a fringe 140 of the bottom-face side of the solder guiding face 110. Thereby, the bottom part of the solder guiding terminal 120 becomes projected towards the solder ball 510 side, so that the solder flow-down amount when the solder is melted becomes suppressed at the time of soldering and a sufficient amount of the solder 501 creeps up the solder guiding face 110. This spacer 100 can also be used by turning it upside down so that the upper-end part of the solder guiding face 110 is projected towards the outer side than the lower-end part. In the explanations above, the top face side of the solder guiding face formed in the spacer 110 is taken as one end part, the bottom-face side is taken as the other end part, and a part of the solder guide is formed to project towards the outer side by the difference in the length of the one end part and the length of the other end part. However, the one end part is not limited only to the top face side, and the other end part is not limited only to the bottom-face side. Any structures can be employed, as long as it is the structure in which a part of the solder guiding face is projected due to the difference in the length of the one end part and the length of the other end part of the solder guiding face.

Further, the solder guiding terminal 120 of the spacer 100 may have the solder guiding face 110 that is in a flat face, as long as the solder guiding face 110 makes an acute angle with the bottom face 162. In that case, manufacture of the spacer 100 becomes easy. Particularly, in order to effectively prevent the solder poor connecting state with respect to the connection pad located on the upper side, the solder guiding face 110 is preferable to be in a trapezoid in which the lower side is shorter than the upper side.

Next, a manufacturing method of the spacer 100 according to the first exemplary embodiment will be described.

The manufacturing method of the spacer 100 according to the first exemplary embodiment includes: a hole making step which forms holes on a base member; a metal terminal forming step which forms a metal terminal on the edges of the holes formed on the base member and the inside surface of the holes ; and a cutting step which cuts the base member having the metal terminals.

FIG. 8 is a chart showing the manufacturing steps for illustrating the manufacturing method of the spacer 100 according to the first exemplary embodiment.

Referring to the manufacturing step chart shown in FIG. 8, each of the steps such as the hole making step (s1 in FIG. 8), a thermal oxidation step (s2 in FIG. 8), a mask forming step (s3 in FIG. 8), the metal terminal forming step (s4 in FIG. 8), a mask removing step (s5 in FIG. 8), the cutting step (s6 in FIG. 8), and a re-thermal oxidation step (s7 in FIG. 8) is executed in this order to obtain the spacer 100. Hereinafter, each of the steps will be described.

a. Hole making step (s1 in FIG. 8)

The hole making step is a step for forming the holes on the base member. In the first exemplary embodiment, a silicon wafer 151 as the base member and a pointed tool 810 are prepared (see FIG. 9). The size of the silicon wafer 151 is not specifically limited; however, this exemplary embodiment uses the silicon wafer of 6 inches (about 150 mm) in diameter and 0.5 mm in thickness.

The diameter of the tip of the pointed tool 810 defines the diameter of the hole, and it is slightly larger than the diameter (0.6 mm in this exemplary embodiment) of the solder ball. The shape of the tip part (edge of the tool) of the pointed tool 810 is selected by considering the surface shape of the hole to be formed. This exemplary embodiment uses the pointed tool 810 whose diameter is about 0.8 mm and whose shape of the tip part in the section including the rotation axis is a convex curve (more specifically, almost an arc). In other words, the tip of the projection shape of the pointed tool 810 in the lateral direction of the rotation axis is close to an arc.

While there is no specific limit set for the interval of the holes, it is set as 1.1 mm in this embodiment. It is preferable to adjust the diameter and the intervals of the holes in accordance with a cutting margin of the cutting step (s6 of FIG. 8) to be described later.

FIG. 10 is a sectional view of the silicon wafer 151 in the hole making step. FIG. 10 shows a hole 152 already formed in the silicon wafer 151 and the pointed tool 810 that is in action of opening a hole. Through repeating the hole making action in this manner, a silicon wafer 151a having the holes 152 can be obtained (see FIG. 11). In the first exemplary embodiment, the hole making action is performed by supplying ultrasonic vibrations and rotary motions to the pointed tool while pouring a solvent containing abrasive grains. However, it is also possible to execute the hole making actions by combining this method with a sand blast method, a laser processing method, etching, and the like.

b. Thermal Oxidation Step (s2 in FIG. 8)

The thermal oxidation step is a step which thermal-oxidizes the base member having the holes to form an oxide film on the surface thereof. In the first exemplary embodiment, the silicon wafer 151a obtained after performing the hole making step is thermal-oxidized to form an oxide film (e.g., a silicon oxide film) on the surface thereof. The electrically insulating oxide film is formed on the surface since silicon is not an insulator. Specifically, the silicon wafer 151 a is placed in an electric furnace to be heated. The condition of the electric furnace is not specifically limited, as long as it is the condition with which the silicon oxide film is formed sufficiently. For example, oxygen is supplied at a set temperature of 950° C., and this state is maintained for 16 hours. With this, a silicon wafer 151b having the oxide film on the surface thereof can be obtained (see FIG. 12).

c. Mask Forming Step (s3 in FIG. 8)

The mask forming step is a step which forms a mask on a part excluding the holes on the top face of the base member. In the first exemplary embodiment, the mask is formed on the part excluding the holes 152 on the top face of the silicon wafer 151b that has the oxide film on the surface thereof. FIG. 13 is a schematic perspective view of a silicon wafer 151c on which the mask is formed. Out of the top face of the silicon wafer 151b, a resist 180 is applied to the part excluding the inside surfaces of the holes 152 and fringes 153 of the holes 152 to form the mask. The resist 180 is applied to both surfaces of the silicon wafer 151b. Thereby, the silicon wafer 151c on which the mask is formed can be obtained.

There is no specific limit set for the types of the resist 180, as long as it can be removed at a latter step. It is preferable to remove the resist 180 before the re-thermal oxidation step (s7 in FIG. 8). This is because a volume increase may occur due to combustion or oxidation when the resist 180 is exposed to high temperatures in the re-thermal oxidation step (s7 in FIG. 8).

d. Metal Terminal Forming Step (s4 in FIG. 8)

The metal terminal forming step is a step which forms the metal terminals on the fringes of the holes and inside surface of the holes on the base member. In this exemplary embodiment, DC sputtering is performed on the silicon wafer 151c on which the mask is formed so as to form a metal film on the surface of the silicon wafer 151c. Thereby, a silicon wafer 151d on which the metal film is formed can be obtained (see FIG. 14). The metal film of this embodiment is structured with a base that is made with titanium of 50 nm in thickness and the uppermost layer made with gold of 300 nm in thickness. An intermediate layer can also be interposed between the base and the uppermost layer. There is no specific limit set for the metal to be used for the intermediate layer and the metal to be used for the uppermost layer as long as those are the substances which are not melted or transmuted in the re-thermal oxidation step (s7 in FIG. 8), and the metals can be selected by considering the soldering wettability.

e. Mask Removing Step (s5 in FIG. 8)

The mask removing step is a step which removes the mask formed on the base member. In the first exemplary embodiment, the mask made with the resist 180 on the surface of the silicon wafer 151d is removed by a mask release agent. At this time, the metal film applied on the surface mask is also removed along with the mask. Thereby, a silicon wafer 151e having the metal terminals 154 can be obtained (see FIG. 15).

f. Cutting Step (s6 in FIG. 8)

The cutting step is a step which cuts the base member having the metal terminals. FIG. 16 shows an explanatory illustration of the cutting step. In the cutting step of the first exemplary embodiment, the silicon wafer 151e having the metal terminals 154 is cut along each of lines 181, 182, 183, and 184 shown in FIG. 16. Thereby, silicon wafer pieces 151f can be obtained (see FIG. 17). As show in FIG. 17, silicon is exposed at cut faces 185 of the silicon wafer piece 151f.

g. Re-Thermal Oxidation Step (s7 in FIG. 8)

The re-thermal oxidation step is a step which forms an oxide film on the cut faces by thermal-oxidizing the cut base member to obtain a spacer. The re-thermal oxidation step of the first exemplary embodiment is executed in the same procedure as that of the thermal oxidation step (s2 in FIG. 8) for forming the oxide film on the cut faces 185 of the silicon wafer piece 151f. Thereby, the oxide film is formed on the cut faces 185 of the silicon wafer piece 151f, and the cut faces 185 are insulated electrically. With this, the spacer 100 whose external size is about 1 mm in width, about 1 mm in the depth, and about 0.5 mm in height can be obtained (see FIG. 1).

As described above, the method for manufacturing the spacer 100 according to the first exemplary embodiment has a part that employs the same method as a typical semiconductor manufacturing step, so that it is possible to control the precision of the size of the solder guiding terminal 120 (the metal terminal 154) with a unit of several µm. Further, it also has an advantage of being able to form the external diameter with precision of at least 100 µm. It is possible to form the solder guiding terminal 120 with precision of 1 µm by using a laser in the hole making step (s1 in FIG. 8) and the cutting step (s6 in FIG. 8).

While silicon is used as the material for the base member, the material is not limited only to that. For example, it is also possible to use a resin such as plastics. The resin-made base member can be obtained by a method which pours a resin raw material into a mold and sets it by heat or chemical reaction. When the resin used as the material for the base member is of an insulating type, it is possible to omit the thermal oxidation step (s2 in FIG. 8) which forms the electrically insulating oxide film. When the size of the spacer 100 can be formed to be several mm or more, it is also possible to manufacture the spacer 100 with a step which makes holes on a resin-made plate member, a step which forms metal terminals by electroless plating or the like, and a cutting step.

Next, a use example of the spacer 100 will be described.

As described above, the spacer 100 can be used as a spacer which supports the clearance between the LSI 300 and the printed circuit board 400 when soldering the LSI 300 to the printed circuit board 400 (see FIG. 3-FIG. 7).

Further, the spacer 100 can be used as a spacer which supports the clearance between the semiconductor circuit chip and the interposer when obtaining the LSI by mounting the semiconductor chip to the interposer. FIG. 25 is a schematic sectional view of the LSI that is in the structure in which a semiconductor circuit chip 330 is mounted to an interposer 310.

As shown in FIG. 25, the LSI 300 is obtained by mounting the semiconductor chip 330 to the interposer 310. The interposer 310 has interposer pads 311 on the surface thereof, and the semiconductor circuit chip 330 has semiconductor chip pads 331 on the surface thereof. The semiconductor circuit chip 330 is mounted to the interposer 310 through connecting the interposer pads 311 and the semiconductor chip pads 331 by soldering using the solder balls 511. The spacer 100 is placed between the semiconductor circuit chip 330 and the interposer 310 at the time of mounting.

Regarding the spacer 100, the solder guiding face 110 of the solder guiding terminal 120 is non-perpendicular to the bottom face 162, and the angle between the solder guiding face 110 and the bottom face 162 is an acute angle. Thus, flow-down of the solder towards the lower side when the solder balls 511 are melted can be prevented, and the solder is guided to the upper side. As a result, there is no shortage of solder occurred on the upper side of the solder guiding face, so that secure connection of the semiconductor chip pads 331 and the solder can be achieved.

Further, the spacer 100 can also be used as a spacer when mounting a slave board to the printed circuit board. FIG. 26 is a schematic sectional view showing a state where a slave board 401 is mounted to the printed circuit board 400.

As shown in FIG. 26, the PWB resin 410 part of the printed circuit board 400 has PWB pads 420 on the surface thereof, and the slave board 401 has slave board pads 425 on the surface thereof. The slave board 401 is mounted to the printed circuit board 400 through connecting the PWB pads 420 and the slave board pads 425 by soldering using the solder balls 510. The spacer 100 is placed between the slave board 401 and the printed circuit board 400 at the time of mounting. Regarding the spacer 100, the solder guiding face 110 of the solder guiding terminal 120 is non-perpendicular to the bottom face 162, and the angle between the solder guiding face 110 and the bottom face 162 is an acute angle. Thus, flow-down of the solder to the lower side when the solder balls 510 are melted can be prevented, and the solder is guided to the upper side. As a result, there is no shortage of solder occurred on the upper side of the solder guiding face, so that secure connection of the slave board pads 425 and the solder can be achieved.

As described above, the spacer 100 according to the first exemplary embodiment is a spacer which is placed between both electronic components when connecting the pads of the two electronic components on the upper side and the lower side by soldering. It is a feature of this spacer that it has the solder guiding face 110 at the side face on which the surface processing is applied for providing fine wettability with the solder, and has a shape in which the lower end part is projected to the outer side than the upper end part. Thus, when the spacer 100 is placed in such a manner that the solder guiding face 110 is pushed into the soldering part, the solder drawn to the solder guiding face 110 can be guided to the upper side. Therefore, a poor connection state between the pads on the upper side and the solder can be prevented. This spacer 100 can also be used by turning it upside down so that the upper-end part of the solder guiding face 110 is projected towards the outer side than the lower-end part.

Next, a second exemplary embodiment of the present invention will be described.

FIG. 18 is a perspective view showing the shape of a spacer 101 according to the second exemplary embodiment of the invention. As shown in FIG. 18, the spacer 101 of the second exemplary embodiment has six solder guiding terminals 120, 121, 122, 123, 124, and 125. When the spacer 101 in such space is applied to the use example shown in FIG. 25 or FIG. 26 instead of the spacer 100, the connection state between the components can be stabilized further since there are more points fixed by solder, and the area of the top face and the bottom face supporting the clearance is larger than the case of using the spacer 100 of the first exemplary embodiment.

Basically, a method for manufacturing the spacer 101 according to the second exemplary embodiment is the same as that of the first exemplary embodiment described above. The method for manufacturing the spacer 101 executes each of steps such as a hole making step (s1 in FIG. 8), a thermal oxidation step (s2 in FIG. 8), a mask forming step (s3 in FIG. 8), the metal terminal forming step (s4 in FIG. 8), and a mask removing step (s5 in FIG. 8) in this order, but a position of cut in the cutting step (s6 in FIG. 8) is set as a line 184a (see FIG. 19) instead of the line 184 (see FIG. 16). After that, a re-thermal oxidation step (s7 in FIG. 8) is executed by using the silicon wafer piece 151f obtained at the cutting step. Thereby the spacer 101 is obtained. As described, by selecting the hole making positions and the cutting positions as appropriate, the spacer having a prescribed number of solder guiding terminals can be obtained.

Next, a third exemplary embodiment of the invention will be described.

FIG. 20 is a perspective view showing the shape of a spacer 102 according to the third exemplary embodiment of the invention. Compared to the spacer 100 of the first exemplary embodiment shown in FIG. 1, the shape of the solder guiding faces 110 of the solder guiding terminals 120, 121, 122, and 123 of the spacer 102 according to the third exemplary embodiment are different. As shown in FIG. 20, the shape of the solder guiding faces 110 of the solder guiding terminals 120, 121, 122, and 123 of the spacer 102 is in a surface shape that is obtained by cutting a vertically inverted frustum hole in a vertical direction, in which each of a fringe 130 on the top face side and a fringe 140 on the bottom face side is an arc and a side fringe 135 is a straight line.

A method for manufacturing the spacer 102 according to the third exemplary embodiment is the same as the above-described method for manufacturing the spacer 100 of the first exemplary embodiment except that the method of the third exemplary embodiment uses a pointed tool whose tip part shape in the section including the rotation axis is almost a straight-line form (i.e., a pointed tool whose projection-form tip in the lateral direction of the rotation axis of the tip part (edge) is in a straight line) in the hole making step (s1 in FIG. 8).

After the hole making step (s1 in FIG. 8), a thermal oxidation step (s2 in FIG. 8), a mask forming step (s3 in FIG. 8), a metal terminal forming step (s4 in FIG. 8), a mask removing step (s5 in FIG. 8), a cutting step (s6 in FIG. 8), and a re-thermal oxidation step (s7 in FIG. 8) are executed. Thereby, the spacer 102 is obtained.

The method for manufacturing the spacer 102 according to the third exemplary embodiment uses the pointed tool whose tip part (edge) is in a straight line, so that there is such an advantage that the maintenance and management of the manufacturing equipment becomes easy.

Further, in the hole making step (s1 in FIG. 8), it is possible to perform a finishing work by a laser. Note that there is no specific limit set for the flatness of the solder guiding faces.

Next, a fourth exemplary embodiment of the invention will be described.

FIG. 21 is a perspective view showing the shape of a spacer 103 according to the fourth exemplary embodiment of the invention. Compared to the spacer 100 according to the first exemplary embodiment shown in FIG. 1, the shape of the solder guiding faces 110 of the solder guiding terminals 120, 121, 122, and 123 of the spacer 103 according to the fourth exemplary embodiment are different. As shown in FIG. 21, the shape of the solder guiding faces 110 of the solder guiding terminals 120, 121, 122, and 123 of the spacer 103 is a flat face.

Basically, a manufacturing method of the spacer 103 according to the fourth exemplary embodiment is the same as that of the above-described first exemplary embodiment. However, instead of using the pointed tool in the hole making step (s1 in FIG. 8), a laser is irradiated from an oblique direction to form substantially quadrangular-cone shape holes on a silicon wafer.

FIG. 22 shows a perspective view of a silicon wafer 151aa having the substantially quadrangular-cone shape holes 152a obtained at the hole making step (s1 in FIG. 8) and an enlarged view of an area E of the perspective view. Further, FIG. 23 shows a plan view and a sectional view.

Regarding the substantially quadrangular-cone shape hole 152a, both a fringe 1521 on the top face side of the silicon wafer 151 aa and a fringe 1523 on the bottom-face side are quadrilaterals, and there are oblique sides 1522 which connect corresponding vertexes of the two quadrilaterals.

While the quadrilaterals of the fringe 1521 on the top face side of the silicon wafer 151 aa and the fringe 1523 on the bottom-face side according to this exemplary embodiment are squares (see FIG. 23), those may also be rectangles, diamonds, or the like.

Thereafter, as in the first exemplary embodiment, a thermal oxidation step (s2 in FIG. 8), a mask forming step (s3 in FIG. 8), the metal terminal forming step (s4 in FIG. 8), a mask removing step (s5 in FIG. 8), a cutting step (s6 in FIG. 8), and a re-thermal oxidation step (s7 in FIG. 8) are executed. Thereby, the spacer 103 is obtained.

The shape of the solder guiding faces of the solder guiding terminals 120, 121, 122, and 123 of the spacer 103 is a flat face (see FIG. 21).

In the fourth exemplary embodiment, the solder guiding faces are flat faces, so that manufacture thereof becomes easy. Specifically, shift of the laser can be done in a straight-line form, and the processing accuracy obtained thereby is excellent. Further, when a resin is used as the material for the base member in the fourth exemplary embodiment, it is possible to use a straight-line form mold which is easy to manufacture.

Next, a fifth exemplary embodiment according to the invention will be described.

FIG. 24 is a perspective view showing the shape of a spacer 104 according to the fifth exemplary embodiment of the invention. As shown in FIG. 24, the spacer 104 has two solder guiding terminals 120 and 121. The terminal faces of the solder guiding terminals 120 and 121 are flat faces as in the case of the spacer 103 of the fourth exemplary embodiment.

In a method for manufacturing the spacer 104 of the fifth exemplary embodiment, as in the case of the fourth exemplary embodiment, each of steps such as a hole making step (s1 in FIG. 8), a thermal oxidation step (s2 in FIG. 8), a mask forming step (s3 in FIG. 8), the metal terminal forming step (s4 in FIG. 8), and a mask removing step (s5 in FIG. 8) are executed in this order, and a cutting direction is changed in the cutting step (s6 in FIG. 8). Thereafter, a re-thermal oxidation step (s7 in FIG. 8) is executed by using the obtained silicon wafer pieces as in the case of the fourth exemplary embodiment. Thereby, the spacer 104 can be obtained.

It is also possible to change the hole making positions to positions different from those of the fourth exemplary embodiment in the hole making step (s1 in FIG. 8).

As described, it is also possible to manufacture a spacer having only a single solder guiding terminal by changing the cutting line as appropriate in the cutting step (s6 in FIG. 8).

Next, a sixth exemplary embodiment according to the invention will be described.

FIG. 27 is a schematic perspective view showing the shape of a spacer 105 according to the sixth exemplary embodiment. FIG. 28 is a schematic sectional view taken along the F-F line of the spacer 105 disclosed in FIG. 27.

The spacer 105 shown in FIG. 27 is formed with an electrically insulating base member 150, four solder guiding terminals 121a, 121b, 121c, 121d, and a capacitor 710 that is a capacitance element formed inside the base member 150.

The solder guiding faces 110 of the solder terminals 121a, 121b, 121c, and 121d of the spacer 105 are non-perpendicular to the bottom face 162 of the base member 150. Preferably, the angle between the both is an acute angle.

Further, in the spacer 105 of the sixth exemplary embodiment, each of the solder guiding terminals 121a and 121c has a leading terminal 720, and the leading terminals 720 are connected to the capacitor 710. This makes it possible to add a capacitance to a desired terminal such as a power supply terminal or the like of the LSI 300.

Compared to the spacer 100 of the first exemplary embodiment shown in FIG. 1, the spacer 105 is different in respect that the capacitor 710 is formed inside the base member 150, the two solder guiding terminals 121a and 121c have the leading terminal 720, and the leading terminals 720 are connected to the capacitor 710.

As shown in FIG. 28, the capacitor 710 has a structure in which a dielectric layer 750 is stacked on an electrode terminal A730, and an electrode terminal B740 is provided thereon. The electrode terminal A730 is connected to the leading terminal 720 of the solder guiding terminal 121a, and the electrode terminal B730 is connected to the leading terminal 720 of the solder guiding terminal 121c.

Further, in a part between the electrode terminal A730 and the electrode terminal B740 having no dielectric layer 750, the capacitor 710 has an insulating mask 180b for preventing short-circuiting of the electrode terminal A730 and the electrode terminal B740 to keep an electrically insulating state.

This exemplary embodiment uses the capacitor 710 that is formed by a same material as that of a solid aluminum electrolytic capacitor. However, the capacitor is not limited only to such type. It is also possible to employ other types of capacitance elements (e.g., a solid tantalum electrolytic capacitor, a solid niobium electrolytic capacitor, a ceramic capacitor, and a capacitance akin to diode) by changing the materials of the electrode terminal A730, the dielectric layer 750, and the electrode terminal B740.

FIG. 29-FIG. 33 are illustrations showing a use example of the spacer 105 of the exemplary embodiment shown in FIG. 27, which illustrate a case where the spacer 100 is loaded to the clearance between the LSI 300 and the printed circuit board 400.

FIG. 29 is a schematic perspective view showing a state before the LSI 300 is mounted to the printed circuit board 400. FIG. 30 is a schematic end view taken along the G-G line of FIG. 3. FIG. 31 is a schematic perspective view showing a state where the LSI 300 is mounted to the printed circuit board 400. FIG. 32 is a schematic end view taken along the H-H line of FIG. 31. FIG. 33 is a schematic enlarged end view after executing soldering of area D' in FIG. 32.

The use example of the spacer 105 shows the case where the LSI 300 is soldered by placing four spacers 105 at mount positions and by using thirty-six solder balls 510 when mounting the LSI 300 by using the solder balls 510 on the printed circuit board 400 on which electronic components 601, 602, 603, and 604 are mounted. In this use example, the LSI 300 is a type in which a semiconductor circuit chip 330 is mounted to an interposer 310. However, the LSI is not limited only to such type. The LSI may be a resin-molded LSI.

As shown in FIG. 30, a resist 440 for insulation is applied to the surface of a PWB resin 400 of the printed circuit board 400 for preventing short-circuiting with the internal electric circuit of the printed circuit board 400. The solder balls 510 are disposed on PWB pads 420 of the printed circuit board 400.

The solder guiding faces 110 of the solder guiding terminals 121a-121d are non-perpendicular to the bottom face 162 of the spacer 105, and the angles formed therebetween are preferably acute angles. With this, when heat is applied in a state where the solder guiding face 110 and the solder ball 510 are in contact, the solder 501 is not easily flown downwards along the solder guiding face 110 since the space for the solder 501 generated by the melted solder ball 510 to flow downwards is small (see FIG. 33). In other words, through making the solder guiding faces 110 non-perpendicular to the bottom face 162 and making the occupied volume of the solder guiding terminals 121a-121d on the bottom face side large, flow-down of the melted solder 501 to the lower side can be prevented, and the solder 501 is guided upwards. As a result, there is no shortage of the solder occurred on the upper section of the solder guiding faces 110, so that it is possible to achieve secure connection of the LSI pad 320 and the solder 501.

Like the solder 501, the solder 502 shown in FIG. 33 connects the PWB pad 421, the LSI pad 321, and the solder guiding terminal 120. The solder 503 connects the PWB pad 422 and the LSI pad 322.

Further, as shown in FIG. 29, the spacer 105 is formed to be disposed between a plurality of solder balls 510, and it is not disposed on the outer fringe part of the LSI 300. Thus, the external size of the LSI 300 is not expanded. Furthermore, the spacer 105 is not unified with the LSI 300, which allows more versatility when mounting the LSI 300. This makes it possible to change the soldering condition of the solder balls 510 and the like easily. This is because the solder guiding terminals 121a-121d are fixed to the PWB pads 420 and 421 with the set solders 501 and 502 by soldering, so that it is not necessary to tightly glue the spacer 105 to the printed circuit board 400 in advance.

As in the case of the spacer 100 shown in FIG. 1, it is one of the preferable forms of the spacer 105 to have the solder guiding face 110 of a curved face. Especially, it is one of the preferable forms to be in a concave face. Such shape makes it possible to have a large contact area between a ball-type solder and the solder guiding face 110 in a case of using the ball-type solders (e.g., solder balls 510), so that the flow-down amount of the solder when the solder is melted can be suppressed. This results in preventing a poor connection state. In particular, it is preferable for the solder guiding face 110 to have a shorter arc on the top face side than an arc on the bottom-face side in order to effectively prevent the poor solder connection state with respect to the connection pad located on the upper side.

Note here that "the solder guiding face 110 is a concave face" means that it is in a shape in which an intersection line from the solder guiding face 110 to an arbitrary face that is perpendicular to the bottom face 162 forms a convex line towards the bottom face side. The radius curvature of the concave face of the solder guiding face 110 is set slightly larger than the radius of the solder ball 510. Thus, a relatively large area of the surface of the solder ball 510 comes to be almost in contact with the surface of the solder guiding face 110.

As in FIG. 31 and FIG. 32, in a state where the LSI 300 is placed at a prescribed position of the printed circuit board 400, the solder balls 510 keep almost the original form even though they are being slightly squashed, since those are in a state before reflow. After the reflow, as shown in FIG. 33, the melted solder 501 connects the PWB pad 420, the LSI pad 320, and the solder guiding terminals 121a-121d, and it is set in that state. This is because the flow-down amount of the solder when the solder is melted is small and the solder 501 creeps up the surface of the solder guiding terminals 121a-121d since the solder guiding face 110 almost correspond and meets with the bottom face shape of the solder ball 510. Thereby, a sufficient solder can be secured for connecting to the LSI pad 320 on the upper side, thereby making it possible to effectively prevent a poor connection state between the LSI pad 320 and the PWB pad 420.

The length of a fringe 130 of the top face side of the solder guiding face 110 is longer than the length of a fringe 140 of the bottom-face side of the solder guiding face 110. Thereby, the bottom sections of the solder guiding terminals 121a-121d become protruded towards the solder ball 510 side, so that the solder flow-down amount when the solder is melted becomes suppressed at the time of soldering and a sufficient amount of the solder 501 creeps up the solder guiding face 110.

As described, the spacer 105 is formed to have an acute angle between the solder guiding face and the bottom face 162 and to have a large occupied volume of the solder guiding terminal 120 on the bottom-face side, as in the case of the first exemplary embodiment described above. Thus, flow-down of the melted solder 510 can be prevented and the solder 501 is guided upwards, when the spacer 105 is placed in the clearance between the LSI 300 and the printed circuit board 400 as shown in FIG. 33. As a result, there is no shortage of the solder occurred on the upper section of the solder guiding faces 110, so that it is possible to achieve secure connection of the LSI pad 320 and the solder.

A method for manufacturing the spacer 105 according to the sixth exemplary embodiment includes: a hole making step which forms holes on the base member; a metal terminal forming step which forms metal terminals in the fringes and the inside surfaces of the holes on the base member where the holes are formed as well as in areas to be leading terminals; and a capacitance disposing step which disposes a capacitance element or a capacitance circuit to the inside and/or the surface of the base member.

The capacitance disposing step may be executed after the hole making step and the metal terminal forming step, may be executed before the hole making step and the metal terminal forming step, or may be executed between the hole making step and the metal terminal forming step. However, in order to obtain the spacer having the capacitance element or the capacitance circuit inside the base member, it is preferable to employ the method which executes the capacitance disposing step after the hole making step and the metal terminal forming step or to employ the method which executes the capacitance disposing step between the hole making step and the metal terminal forming step, in respect that it is possible in the hole making step to form the holes for having the capacitance element or the capacitance circuit built therein simultaneously with the holes for forming the metal terminal.

Further, as necessary, the method for manufacturing the spacer 105 can include various kinds of steps such as a hole-making mask forming step, a mask removing step, a thermal oxidation step, a metal-terminal mask forming step, a metal terminal forming step, a mask removing step, a sealing resin forming step, and a cutting step as well as the steps described above.

FIG. 34 is a manufacturing step chart showing the method for manufacturing the spacer 105 of the sixth exemplary embodiment.

As shown in FIG. 34, with the method for manufacturing the spacer 105, each of the steps such as a hole-making mask forming step (p1 in FIG. 34), a hole making step (p2 in FIG. 34), a mask removing step (p3 in FIG. 34), a thermal oxidation step (p4 in FIG. 34), a mask forming step for electrode terminal A (p5 in FIG. 34), an electrode terminal A forming step (p6 in FIG. 34), a mask removing step (p7 in FIG. 34), a capacitance mask forming step (p8 in FIG. 34), a dielectric layer forming step (p9 in FIG. 34), a mask forming step for electrode terminal B (p10 in FIG. 34), an electrode terminal B forming step (p11 in FIG. 34), a mask removing step (p12 in FIG. 34), a metal-terminal mask forming step (p13 in FIG. 34), a metal terminal forming step (p 14 in FIG. 34), a mask removing step (p15 in FIG. 34), a sealing resin forming step (p16 in FIG. 34), and a cutting step (p17 in FIG. 34) is executed in this order.

Note here that the mask forming step for electrode terminal A (p5 in FIG. 34), the electrode terminal A forming step (p6 in FIG. 34), the mask removing step (p7 in FIG. 34), the capacitance mask forming step (p8 in FIG. 34), the dielectric layer forming step (p9 in FIG. 34), the mask forming step for electrode terminal B (p10 in FIG. 34), the electrode terminal B forming step (p11 in FIG. 34), and the mask removing step (p12 in FIG. 34) correspond to the capacitance disposing step which is the step for forming the capacitance element inside the base member. Hereinafter, each of the steps will be described.

<Hole-Making Mask Forming Step (p1 in FIG. 34>

The hole-making mask forming step is a step which forms a mask in a part other than the circular-hole preparation opening positions and etching hole positions on the surface of the base member. First, a mask in which circular-hole preparation opening positions 186 and etching hole positions 187 are opened is formed on the surface of a silicon wafer 151 that is the base member. There is no specific limit set for the size of the silicon wafer 151. However, this exemplary embodiment uses a silicon wafer of 6 inches in diameter (about 150 mm) and about 0.5 mm in thickness.

FIG. 35 is a schematic perspective view of a silicon wafer 151g on which the mask is formed. Note that the part where a circular-hole preparation opening 188 to be described later is formed is the circular-hole preparation opening position 186, and the part where a hole (etching holes 189 to be described later) for having the capacitance element built therein is formed by etching is the etching hole position 187. A resist 180a is applied to the part other than those parts to form the mask. The mask is formed on both surfaces of the silicon wafer 150. Thereby, the silicon wafer 150g on which the mask is formed can be obtained.

There is no specific limit set for the resist 180a, as long as it can be removed in a latter step. Further, the resist 180a is preferable to be removed once before the thermal oxidation step (p4 in FIG. 34). This is because a volume increase may occur due to combustion or oxidation when the resist 180a is exposed to high temperatures in the re-thermal oxidation step.

<Hole Making Step (p2 in FIG. 34)>

The hole making step is a step which forms holes on the base member. As shown in FIG. 36, the silicon wafer 151g on which the mask is formed is dipped into an etching solution 851 in a container 841 to etch the silicon wafer 151g. When the etching holes 189 in a prescribed depth are etched at the etching hole positions 187 of the silicon wafer 151g, the silicon wafer 151g is taken out from the etching solution 851, and it is cleaned and dried. The circular-hole preparation openings 188 are the holes for easily making the circular holes by a drill thereafter, so that it is not necessary to make those holes completely opened through. Thereby, a silicon wafer 151h having the circular-hole preparation openings 188 and the etching holes 189 can be obtained (see FIG. 37).

Subsequently, as shown in FIG. 37, a pointed tool 810 for making the holes on the silicon wafer 151h is prepared. The diameter of the tip of the pointed tool 810 defines the diameter of the holes formed on the silicon wafer 151h, and it is about a size slightly larger than the diameter (0.6 mm in this embodiment) of the solder ball 510 shown in FIG. 4.

The shape of the tip part (edge) of the pointed tool 810 is selected by considering the surface shape of the hole to be formed. This embodiment uses the pointed tool 810 whose diameter is about 0.8 mm and whose shape of the tip part in the section including the rotation axis is a convex curve (more specifically, almost an arc). In other words, the tip of the projection shape of the pointed tool 810 in the lateral direction of the rotation axis is close to an arc. While there is no specific limit set for the interval of the holes, it is set as 1.1 mm in this embodiment. It is preferable to adjust the diameter and the intervals of the holes in accordance with a cutting margin of the cutting step (p17 in FIG. 34) to be described later.

FIG. 38 is an explanatory illustration showing the hole making step. FIG. 38 is a sectional view of a silicon wafer 151l in the middle of the hole making step, which shows the formed hole 152 and the pointed tool 810 that is in action of making a hole. Through repeating the hole making action in this manner, a silicon wafer 151j with a mask having the holes 152 can be obtained (see FIG. 39). In this exemplary embodiment, the hole making action is performed by supplying ultrasonic vibrations and rotary motions to the pointed tool 810 while pouring a solvent containing abrasive grains. However, it is also possible to execute the hole making actions by combining this method with a sand blast method, a laser processing method, etching, and the like.

<Mask Removing Step (p3 in FIG. 34)>

The mask removing step is a step which removes the mask formed on the base member. In this exemplary embodiment, the mask made with the resist 180a is removed by dipping the masked silicon wafer 151j having the holes 152 into a release solution, and the silicon wafer 151j is cleaned and dried to obtain a silicon wafer 151k having the holes 152 (see FIG. 40).

<Thermal Oxidation Step (p4 in FIG. 34)>

The thermal oxidation step is a step which thermal-oxidizes the base member with the holes to form an oxide film on the surface thereof. In this exemplary embodiment, the silicon wafer 151k is thermal-oxidized to form an oxide film (a silicon oxide film) on the surface thereof. The electrically insulating oxide film is formed on the surface since silicon is not an insulator.

Specifically, the silicon wafer 151k is placed in an electric furnace to be heated. The condition of the electric furnace is not specifically limited, as long as it is the condition with which the silicon oxide film is formed sufficiently. For example, oxygen is supplied at a set temperature of 950° C., and this state is maintained for 16 hours. With this, a silicon wafer 151l having the oxide film on the surface thereof can be obtained (see FIG. 41).

<Mask Forming Step for Electrode Terminal A (p5 in FIG. 34)>

The mask forming step for the electrode terminal A is a step which forms the mask in the area having no electrode terminal A on the base member with the holes. In this exemplary embodiment, the mask is formed in the area other than the area for forming the electrode terminals A on the silicon wafer 151l having the oxide film on the surface thereof. FIG. 42 is a schematic perspective view of a silicon wafer 151m on which the mask is formed. FIG. 43 is a schematic end view taken along the I-I line of FIG. 42. The resist 180a is applied to the surface of the silicon wafer 151l except for the area where the electrode terminal A730 is formed so as to form the mask. Thereby, the silicon wafer 151m having the mask for the electrode terminal A can be obtained. There is no specific limit set for the resist 180a, as long as it can be removed in a latter step.

<Electrode Terminal A Forming Step (p6 in FIG. 34)>

The electrode terminal A forming step is a step which forms the electrode terminal A in the area of the base member having the holes, in which the mask is not formed. In this exemplary embodiment, aluminum is vapor-deposited on the area where the mask for the electrode terminals A is not formed among the surface of the silicon wafer 151m having the mask for the electrode terminals A so as to form the electrode terminal A730. This is a same method for forming aluminum wirings in a semiconductor circuit, and it is also possible to use methods other than that method. Further, this exemplary embodiment uses a metal exhibiting a valve action (e.g., tantalum, niobium), since a dielectric substance is formed by anodic oxidation. However, if the dielectric substance is other material, there is no limit set for the material of the electrode. Thereby, a silicon wafer 151n having the electrode terminal A730 with the mask can be obtained (see FIG. 44).

<Mask Removing Step (p7 in FIG. 34)>

The mask removing step is a step which removes the mask formed in the area having no electrode terminal A on the base member. In this exemplary embodiment, the mask made with the resist 180a is removed by dipping the silicon wafer 151n with the mask into a release solution, and the silicon wafer 151n is cleaned and dried to obtain a silicon wafer 151o having the electrode terminal A730 (see FIG. 45).

<Capacitance Mask Forming Step (p8 in FIG. 34)>

The capacitance mask forming step is a step which forms a mask in the area of the base member having the electrode terminal A, in which the capacitance is not to be formed. In this exemplary embodiment, a capacitance mask 180 is formed on the surface of the silicon wafer 151o having the electrode terminal A to obtain a silicon wafer 151p having the capacitance mask 180 (see FIG. 46).

Specifically, a photo-setting resist is applied on the top face of the silicon wafer 151o. At this time, it is preferable to spin the silicon wafer 151o so that the resist can be applied uniformly. Then, a film for light-shielding the mask forming part is placed on the silicon wafer 151o, and light is irradiated to sensitize the resist. Thereafter, cleaning and drying is executed to wash off the unset resist. Thereby, a silicon wafer 151p having the capacitance mask 180 can be obtained. In a case where the extent of the roughness on the surface of the electrode terminal A730 is not great, a resist from which the part where the light is irradiated is removed can also be used suitably. There is no specific limit set for the material of the resist, as long as it is the material with which the capacitance mask 180 can be formed.

<Dielectric Layer Forming Step (p9 in FIG. 34)>

The dielectric layer forming step is a step which forms a dielectric layer in the area of the base material having the capacitance mask, in which the mask is not formed. In this exemplary embodiment, as shown in FIG. 47, the silicon wafer 151p having the capacitance mask is dipped into a chemical conversion solution 853 in a container 841, an anode wiring 892 of a variable power supply 891 is connected to the electrode terminal A730 of the silicon wafer 151p, and a cathode wiring 893 of the variable power supply 891 is connected to a cathode plate 894 in the chemical conversion solution 853. The output voltage of the variable power supply 891 is increased gradually to form a dielectric layer 750 made with an oxide coating film on the surface of the electrode terminal A730. In a case where the electrode terminal A730 is aluminum, the dielectric layer 750 is aluminum oxide. Thereby, a silicon wafer 151q having the dielectric layer 750 can be obtained (see FIG. 48).

<Mask Forming Step for Electrode Terminal B (p10 in FIG. 34)>

The mask forming step for the electrode terminal B is a step which forms the mask in a part of the surface of the dielectric layer of the base member having the dielectric layer. In the exemplary embodiment, the mask is formed in a part of the surface of the dielectric layer 750 of the silicon wafer 151q having the dielectric layer 750. It is necessary to maintain the electrically insulated state between the electrode terminal A and the electrode terminal B, so that an insulating mask 180b for insulation is formed. It is not necessary to remove the insulating mask 180b, and a thermosetting resin having an epoxy resin as a base material is used in this exemplary embodiment. Thereby, a silicon wafer 151r having the mask for the electrode terminal B can be obtained (see FIG. 49).

<Electrode Terminal B forming Step (p11 in FIG. 34)>

The electrode terminal B forming step is a step which forms the electrode terminal B in the area where the mask is not formed among the surface of the dielectric layer of the base member having the dielectric layer. In this exemplary embodiment, a conductive polymer is formed in the area where the insulating mask 180b is not formed among the surface of the dielectric layer 750 of the silicon wafer 151r having the mask for the electrode terminal B. Then, carbon paste and silver paste are applied in order to form an electrode terminal B740. Thereby, a silicon wafer 151s having the electrode terminal B740 with the mask can be obtained (see FIG. 50).

<Mask Removing Step (p12 in FIG. 34)>

The mask removing step is a step which removes the mask formed in the area having no electrode terminal B on the base member. In this exemplary embodiment, the capacitance mask 180 is removed by dipping the silicon wafer 151s having the electrode terminal B with the mask into a release solution, and the silicon wafer 151s is cleaned and dried to obtain a silicon wafer 151t having the electrode terminal B740 (see FIG. 51).

<Mask Forming Step for Metal Terminal (p 13 in FIG. 34)>

The mask forming step for the metal terminal is a step which forms the mask in the area of the base member having the electrode terminal B, in which the metal terminal is not to be formed.

In this exemplary embodiment, a mask 180 is formed with the resist 180a in the area to have no metal terminal on the top face and the bottom face of the silicon wafer 151t having the electrode terminal B740. Thereby, a silicon wafer 151u having the electrode terminal B740 with the mask can be obtained (see FIG. 52).

<Metal Terminal Forming Step (p14 in FIG. 34)>

The metal terminal forming step is a step which forms the metal terminal on the areas to be the fringes of the holes and inside surface of the holes as well as the area to be a leading terminal of the base member. In this exemplary embodiment, DC sputtering is performed on the silicon wafer 151p so as to form a metal terminal on the areas to be the fringes 153 of the holes and inside surface of the holes 152 on both sides of the silicon wafer 151u as well as the area to be the leading terminal 720. Thereby, a silicon wafer 151v having the metal terminal can be obtained (see FIG. 53). The metal terminal of this exemplary embodiment is structured with a base that is made with titanium of 50 nm in thickness and the uppermost layer made with gold of 300 nm in thickness. An intermediate layer can also be interposed between the base and the uppermost layer. There is no specific limit set for the metal to be used for the intermediate layer and the metal used for the uppermost layer as long as those are the substances which are not melted or transmuted at the time of soldering, and the metals can be selected by considering the soldering wettability.

<Mask Removing Step (p15 in FIG. 34)>

The mask removing step is a step which removes the mask formed on the base member in the area where the metal terminal is not to be formed. In this exemplary embodiment, the mask made with the resist 180a is removed by dipping the silicon wafer 151v having the metal terminal with the mask into a release solution, and the silicon wafer 151v is cleaned and dried to obtain a silicon wafer 151w having the metal terminal (see FIG. 54).

<Sealing Resin Forming Step (p16 in FIG. 34)>

The sealing resin forming step is a step which fills a sealing resin into the etching holes on the base member. In this exemplary embodiment, a sealing resin 180c is filled into the etching holes 189 of the silicon wafer 151w to obtain a silicon wafer 151x having the sealing resin 180c (see FIG. 55). This exemplary embodiment uses an epoxy-based thermosetting resin as the sealing resin 180c. However, it is also possible to use urethane-based resins. Among those, resins used for sealing semiconductor packages and capacitors are preferable, since those resins can prevent corrosions generated due to oxidation or moisture.

<Cutting Step (p17 in FIG. 34)>

The cutting step is a step which cuts the base member having the metal terminal. FIG. 56 shows an explanatory illustration of the cutting step of the exemplary embodiment. In this exemplary embodiment, a cutting margin 170 (see FIG. 27) is provided in advance, and the silicon wafer 151x is cut by a dicer along each of broken lines 171, 172, 173, and 174 shown in FIG. 56. At this time, it is necessary to be careful so as not have the solder guiding terminal 120 (see FIG. 27) caught in the edge of the dicer. This is because it is necessary to prevent short-circuiting with the solder guiding terminal 120 since the conductive silicon becomes exposed to the cut face when the silicon wafer 151x is cut. Thereby, the spacer 105 can be obtained (see FIG. 27).

There is no specific limit set for the external size of the spacer 105. For example, the spacer 105 can be formed in a size of about 1 mm in width, about 1 mm in depth, and about 0.5 mm in height.

As described above, the method for manufacturing the spacer 105 of the sixth exemplary embodiment has a part that employs the same method as that of the semiconductor manufacturing step, so that it is possible to control the precision of the size of the metal terminal with a unit of several µm. Further, it also has an advantage of being able to form the external diameter with precision of at least 100 µm. It is possible to form the solder guiding terminal 120 with precision of 1 µm by using a laser in the hole making step (p2 in FIG. 34) and the cutting step (p17 in FIG. 34).

While silicon is used as the material for the base member, the material is not limited only to that. For example, it is also possible to use a resin such as plastics. The resin-made base member can be obtained by a method which pours a resin raw material into a mold and sets it by heat or chemical reaction. When the resin used as the material for the base member is of an insulating type, it is possible to omit the thermal oxidation step (p4 in FIG. 34) which forms the electrically insulating oxide film.

When the size of the spacer 105 can be formed to be several mm or more, it is also possible to manufacture the spacer 105 with a built-in capacitance by a step which makes holes on a resin-made plate member, a step which forms the metal terminal by electroless plating or the like, and a cutting step.

Note here that the capacitor 710 built-in to the spacer 105 of the sixth exemplary embodiment is not limited to the structure shown in FIG. 28. As shown in FIG. 57, the capacitor 710 may be in a structure having two layers each of the dielectric layers 750 and the electrode terminals B740, in which the electrode terminal B740, the dielectric layer 750, the electrode terminal A730, the dielectric layer 750, and the electrode terminal B740 are stacked in this order.

With the method for manufacturing the spacer 105 in this case, after the hole making step (p2 in FIG. 34), the mask removing step (p3 in FIG. 34) and the thermal oxidation step (p4 in FIG. 34), a step for disposing the capacitor fabricated in advance into the etching hole 189 is executed as the capacitance disposing step instead of executing the mask forming step for electrode terminal A (p5 in FIG. 34), the electrode terminal A forming step (p6 in FIG. 34), the mask removing step (p7 in FIG. 34), the capacitance mask forming step (p8 in FIG. 34), the dielectric layer forming step (p9 in FIG. 34), the mask forming step for electrode terminal B (p10 in FIG. 34), the electrode terminal B forming step (p11 in FIG. 34), and the mask removing step (p12 in FIG. 34). Thereafter, the steps after the mask forming step for the metal terminal (p13 in FIG. 34) are executed. With this, there is no specific limit set for the structure of the capacitor 710. This makes it easy to have a high-performance capacitance element, thereby making it possible to form a capacitor of a multi-layered structure as shown in FIG. 57.

Further, the capacitor 710 is not limited only to the capacitance element but may be a capacitance circuit (e.g., a low-pass filter, a high-pass filter, a band-pass filter, a diode bridge, or a rectifier circuit). Such capacitance element or the capacitance circuit may be provided in the inside or the surface of the base member 150, or may be provided in both.

Next, FIG. 58-FIG. 56 show another example of the sixth exemplary embodiment.

FIG. 58 is a perspective view showing the external appearance of a spacer 106 with a built-in capacitance element, which includes six solder guiding terminals 121a, 121b, 122, 123, 124, and 125. This spacer 106 is structured by having the capacitance element such as a capacitor built-in to the spacer 101 (see FIG. 18) of the second exemplary embodiment described above. As shown in FIG. 58, the spacer 106 is in a structure in which a leading terminal 720 is provided to the solder guiding terminal 121a and the solder guiding terminal 124, and the capacitance element is connected between both of the leading terminals 720.

With the method for manufacturing the spacer 106, the cutting position in the cutting step (p17 in FIG. 34) of the method for manufacturing the spacer 105 described above is set to a broken line 172a (see FIG. 56) instead of the broken line 172. Thereby, the spacer 106 can be obtained.

This spacer 106 has six solder guiding terminals, so that it can be fixed more strongly. Further, the area of the top face and bottom face supporting the LSI becomes increased, so that a more stabilized state can be obtained. Furthermore, through applying such manufacturing method, it is possible to obtain a spacer having a prescribed number of solder guiding terminals by properly selecting the positions of the holes 152 in the hole making step and the cutting positions in the cutting step.

FIG. 59 is a perspective view showing the external appearance of a spacer 107 whose solder guiding face shape is different from that of the spacer 105. This spacer 107 is structured by having a capacitance element such as a capacitor built-in to the spacer 102 (see FIG. 20) of the third exemplary embodiment described above. As shown in FIG. 59, regarding the shape of the solder guiding faces of the solder guiding terminals 120, 121, 122, and 123 provided to the spacer 107, each of an intersection line 130 with the top face of the spacer and an intersection line 140 with the bottom face is an arc, and an intersection line 135 with other side face is a straight line. Further, a leading terminal 720 is provided to the solder guiding terminal 120 and the solder guiding terminal 122, and the capacitance element is connected between the both leading terminals 720.

A method for manufacturing the spacer 107 is basically the same as the above-described method for manufacturing the spacer 105. However, a pointed tool used in the hole making step is a tool whose tip part shape in the section including the rotation axis is almost straight-line form (i.e., a pointed tool whose projection-form tip in the lateral direction of the rotation axis of the tip part (edge) is in a straight line).

FIG. 60 is a perspective view showing the external appearance of a spacer 108 whose solder guiding face shape is a flat face. This spacer 108 is structured by having a capacitor 710 built-in to the spacer 103 (see FIG. 21) of the fourth exemplary embodiment described above. As shown in FIG. 60, the solder guiding faces of the solder guiding terminals 122a, 122b, 122c, and 123d provided to the spacer 107 are flat faces. Both an intersection line 130 with the top face of the spacer and an intersection line 140 with the bottom face are straight lines, and an intersection line 135 with neighboring side face is a straight line as well. Further, a leading terminal 720 is provided to the solder guiding terminal 122a, 122b, 122c, and 123d, and the capacitance element is connected between those leading terminals 720.

A method for manufacturing the spacer 108 is basically the same as the above-described method for manufacturing the spacer 105. However, instead of using the pointed tool in the hole making step, a laser is irradiated from an oblique direction to form substantially quadrangular-pyramid shape holes on a silicon wafer. As described, the spacer 108 has the flat solder guiding faces 110, so that manufacture thereof is easy.

FIG. 61 is a perspective view showing the external appearance of a spacer 109 having two solder guiding terminals 120 and 121. This spacer 109 is structured by having a capacitance element such as a capacitor built-in to the spacer 104 (see FIG. 24) of the fifth exemplary embodiment described above. As shown in FIG. 61, the spacer 109 has the two solder guiding terminals 120 and 121. The terminal faces of the solder guiding terminals 120 and 121 are flat faces as in the case of the fourth exemplary embodiment. A leading terminal 720 is provided to the solder guiding terminal 120 and 121, and the capacitance element is connected between those leading terminals 720.

A method for manufacturing the spacer 109 is basically the same as the above-described method for manufacturing the spacer 108. However, the cutting line in the cutting step is changed.

As described, the spacers 105-109 according to the sixth exemplary embodiment are the spacers having the capacitance element such as the capacitor built-in to the spacers 100-104 according to the first-fifth exemplary embodiments described above. This makes it possible to utilize the space for mounting the spacer effectively and to add the capacitance to a desired terminal such as a power supply terminal or the like of the LSI.

Next, a spacer according to another exemplary embodiment of the invention includes an electrically insulating base member and a solder guiding terminal, and the solder guiding face is non-perpendicular to the bottom face of the spacer. Through disposing this spacer between the solder and the solder in the clearance between a semiconductor device and a printed circuit board, it is possible to avoid an unnecessary increase in the external size of the semiconductor device. Further, the clearance width between the semiconductor device and the printed circuit board can be set freely by changing the thickness of the spacer of this exemplary embodiment, and the soldering conditions such as the material, the size, and the like of the solder ball can be changed easily. Furthermore, this spacer makes it possible to prevent a poor connection state between the semiconductor device and the printed circuit board caused due to drawing of the solder to the solder guiding face by making the solder guiding face non-perpendicular.

The spacer of this exemplary embodiment is a spacer having an electric insulating base member and at least one solder guiding terminal. The surface of the base member is formed with a bottom face, a top face, and at least one side face. The bottom face and the top face do not come in contact with each other, and the side face is a face which is in contact with one of or both of the bottom face and the top face. The solder guiding terminal covers a part of the bottom face, a part of the top face, and a part of or a whole part of the side face, and a solder guiding face that is the surface part covering the side face of the solder guiding terminal is non-perpendicular with respect to the bottom face.

Further, in the spacer of this exemplary embodiment, the solder guiding face may be a curved face or may be a concave face. Furthermore, in the spacer of this exemplary embodiment, the solder guiding face may be a flat face.

A manufacturing method of the spacer according to the exemplary embodiment includes: a hole making step which forms holes on a base member; a metal terminal forming step which forms a metal terminal on the fringes of the holes formed on the base member and the inside surface of the holes; and a re-thermal oxidation step which thermal-oxidizes the base member having the metal terminal to form an oxide film on the cut faces so as to obtain the spacer.

This manufacturing method may include, between the hole making step and the metal terminal forming step, a mask forming step which forms a mask in an area where the solder guiding terminal is not formed among the base member on which the holes are formed. At the same time, the manufacturing method may include, between the metal terminal forming step and the re-thermal oxidation step, a mask removing step which removes the mask formed in the area where the solder guiding terminal is not formed among the base member.

Further, immediately after the hole making step, the manufacturing method may include a thermal oxidation step which thermal-oxidizes the base member on which the holes are formed so as to form an oxide film on the surface thereof. Right before the re-thermal oxidation step, the manufacturing method may include a cutting step which cuts the base member having the metal terminal. The hole making step may be executed by using a pointed tool, and the shape of the tip part in the section including the rotation axis may be a convex curve.

A spacer according to another exemplary embodiment of the present invention is a spacer with a built-in capacitance, which includes an electric insulating base member, and at least one solder guiding terminal, and a capacitance element or a capacitance circuit provided inside and/or the surface of the base member. The surface of the base member is formed with a bottom face, a top face, and at least one side face. The bottom face and the top face do not come in contact with each other, and the side face is a face which is in contact with one of or both of the bottom face and the top face. The solder guiding terminal covers a part of the bottom face, a part of the top face, and a part of or a whole part of the side face, and a solder guiding face that is the surface part covering the side face of the solder guiding terminal is non-perpendicular with respect to the bottom face. A part of or all of the solder guiding terminals is connected to the capacitance element or the capacitance circuit.

Further, in the spacer with the built-in capacitor, the angle between the solder guiding terminal and the bottom face may be an acute angle, and the solder guiding terminal face may be a curved face. Further, the solder guiding terminal face may be a concave face or the solder guiding terminal face may be a flat face.

The capacitance element built-in to the spacer of the exemplary embodiment may be a solid aluminum electrolytic capacitor or a ceramic capacitor.

Next, a manufacturing method of the spacer with the built-in capacitor according to the exemplary embodiment includes: a hole making step which makes holes on a base member; a metal terminal forming step which forms a metal terminal on the fringes of the holes formed on the base member and the inside surface of the holes as well as the area to be a leading terminal; and a capacitance disposing step which disposes the capacitance element or the capacitance circuit to the inside and/or the surface of the base member.

In the hole making step, the holes are formed on the base member by using a pointed tool, and the shape of the tip part in the section including the rotation axis may be a convex curve.

A large scale integrated circuit of the exemplary embodiment is a circuit in which a semiconductor circuit chip having a semiconductor chip pad on the surface thereof is mounted to an interposer having an interposer pad on the surface thereof. It is the large scale integrated circuit in which the above-described spacer with the built-in capacitance is used when mounting the semiconductor circuit chip to the interposer by connecting the interposer pad and the semiconductor chip pad by using a solder ball.

A printed circuit board of the exemplary embodiment is a board which includes on the surface thereof a PWB resin part having a PWB pad, and has a slave board having a slave board pad on the surface thereof mounted thereon. It is the printed circuit board in which the above-described spacer with the built-in capacitance is used when mounting the slave board by connecting the PWB pad and the slave board pad by using a solder ball.

While the present invention has been described by referring to the embodiments (and examples), the present invention is not limited only to those embodiments (and examples) described above. Various kinds of modifications that occur to those skilled in the art can be applied to the structures and details of the present invention within the scope of the present invention.

This Application claims the Priority right based on Japanese Patent Application No. 2007-218546 filed on Aug. 24, 2007 as well as Japanese Patent Application No. 2007-264835 filed on Oct. 10, 2007, and the disclosure thereof is hereby incorporated by reference in its entirety.

Industrial Applicability

The present invention makes it possible to keep a uniform clearance width between the soldering targets when connecting a mounting board to an electronic component, such as a printed circuit board to a printed circuit board, a printed circuit board to a semiconductor circuit, and a printed circuit board to various devices through soldering by using solder or the like.

REFERENCE NUMERALS

Figure 1:
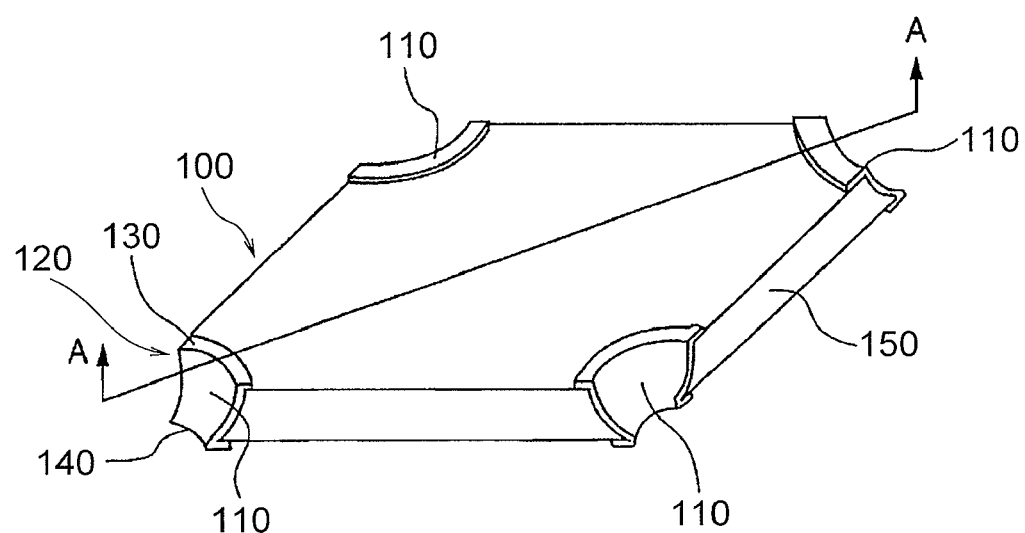
FIG. 1 is a schematic perspective view showing the shape of a spacer according to a first exemplary embodiment of the invention.
Figure 2:
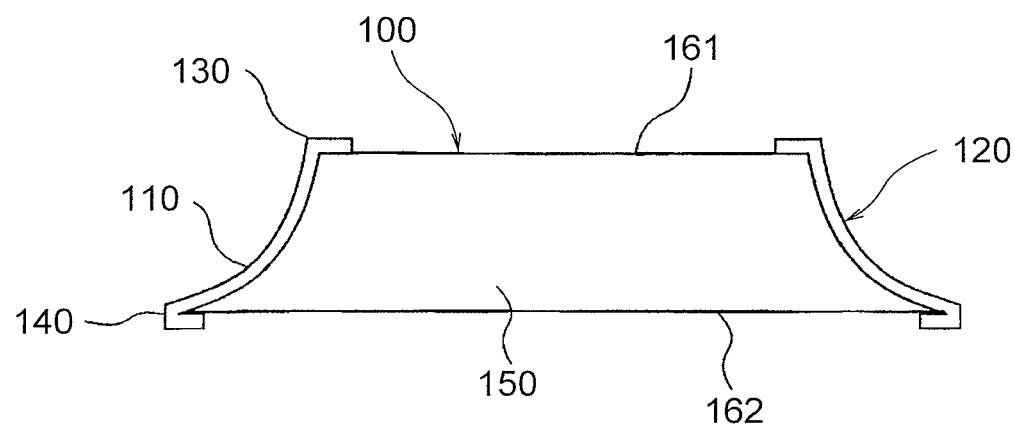
FIG. 2 is a schematic end view taken along the A-A line of the spacer of the exemplary embodiment disclosed in FIG. 1.
Figure 3:
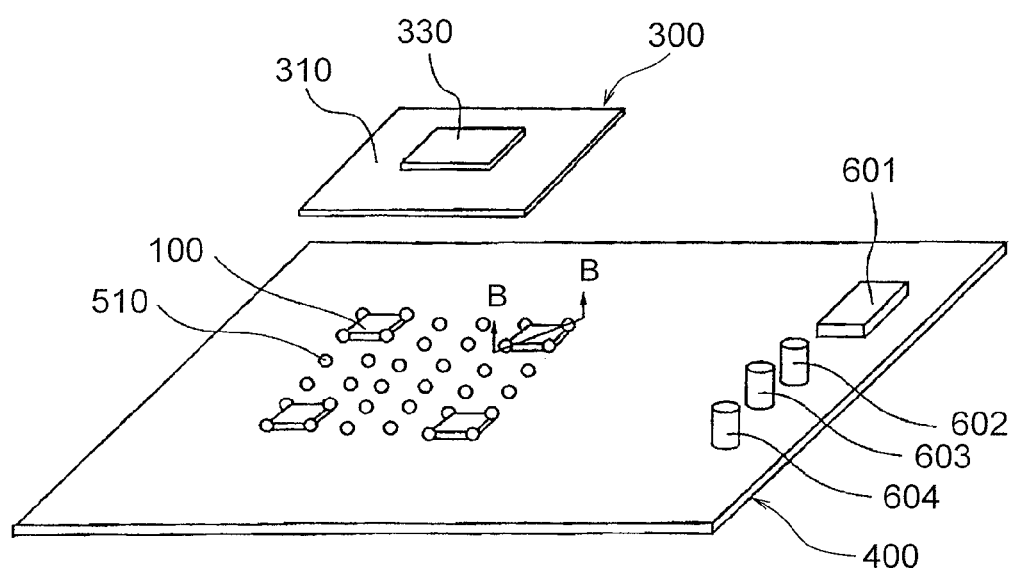
FIG. 3 is a schematic perspective view showing a use example of the spacer of the exemplary embodiment disclosed in FIG. 1.
Figure 4:
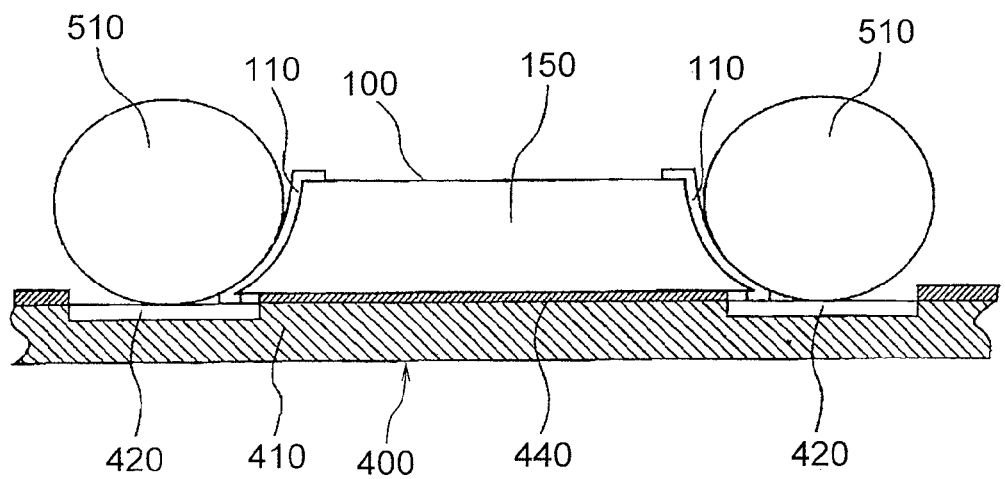
FIG. 4 is a schematic end view taken along the B-B line of FIG. 3.
Figure 5:
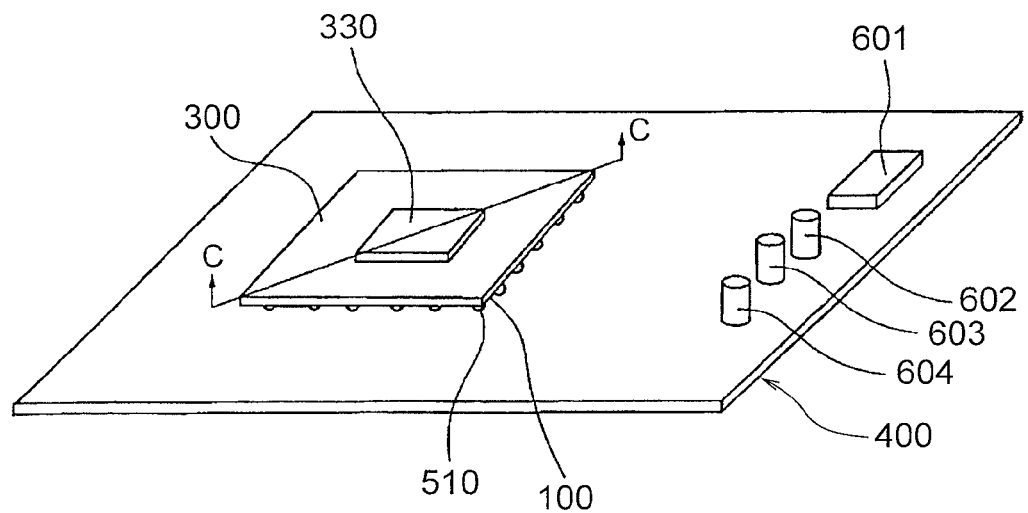
FIG. 5 is a schematic perspective view showing the use example of the spacer of the exemplary embodiment disclosed in FIG. 1.
Figure 6:
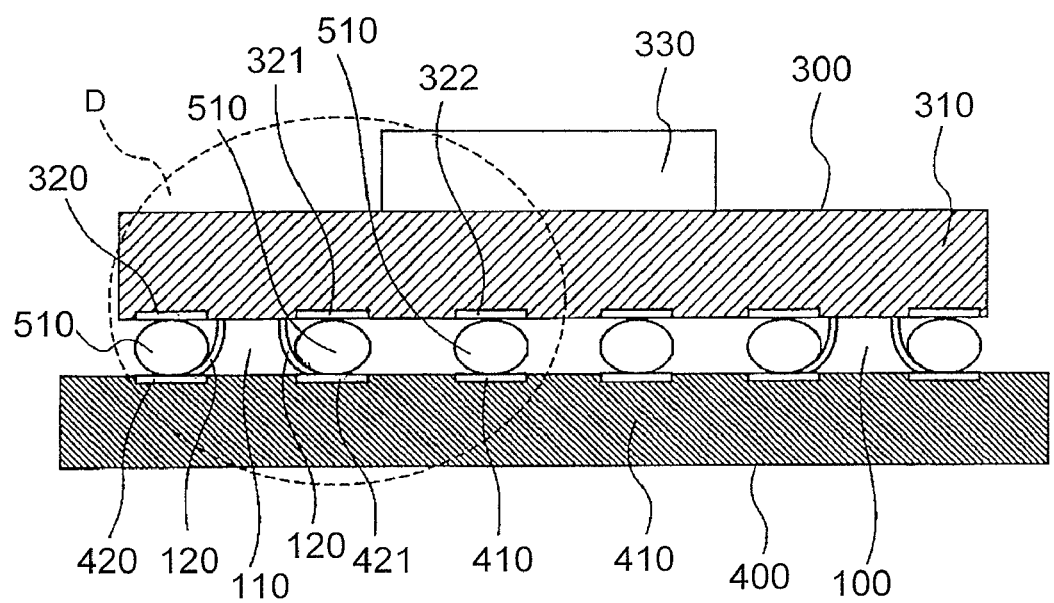
FIG. 6 is a schematic end view taken along the C-C line of FIG. 5.
Figure 7:
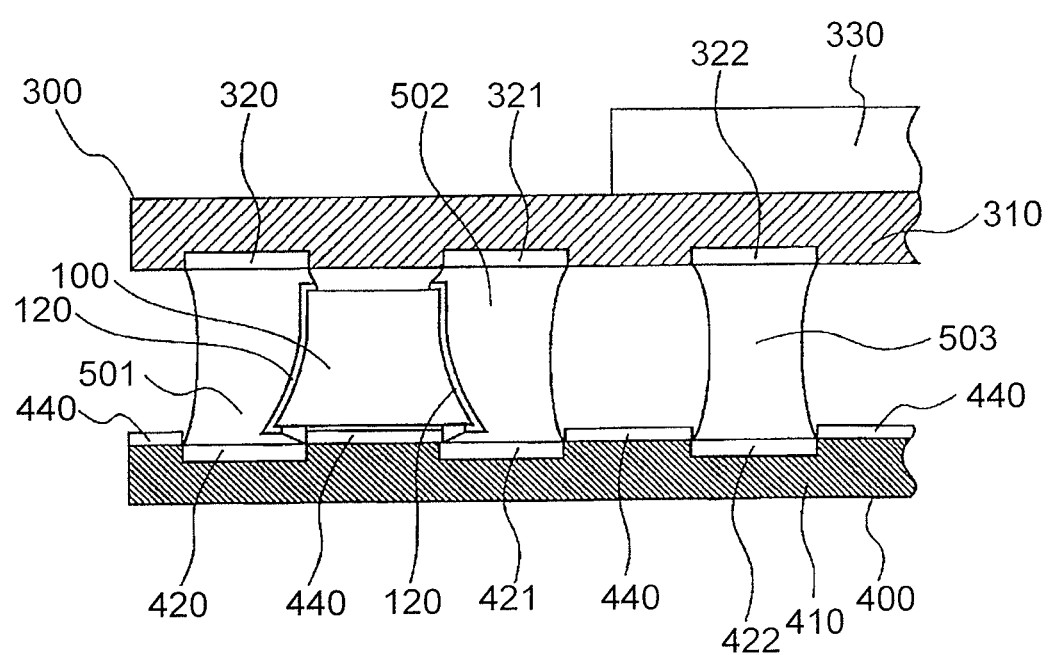
FIG. 7 is a schematic enlarged end view showing a state after soldering an area D of FIG. 6.
Figure 8:
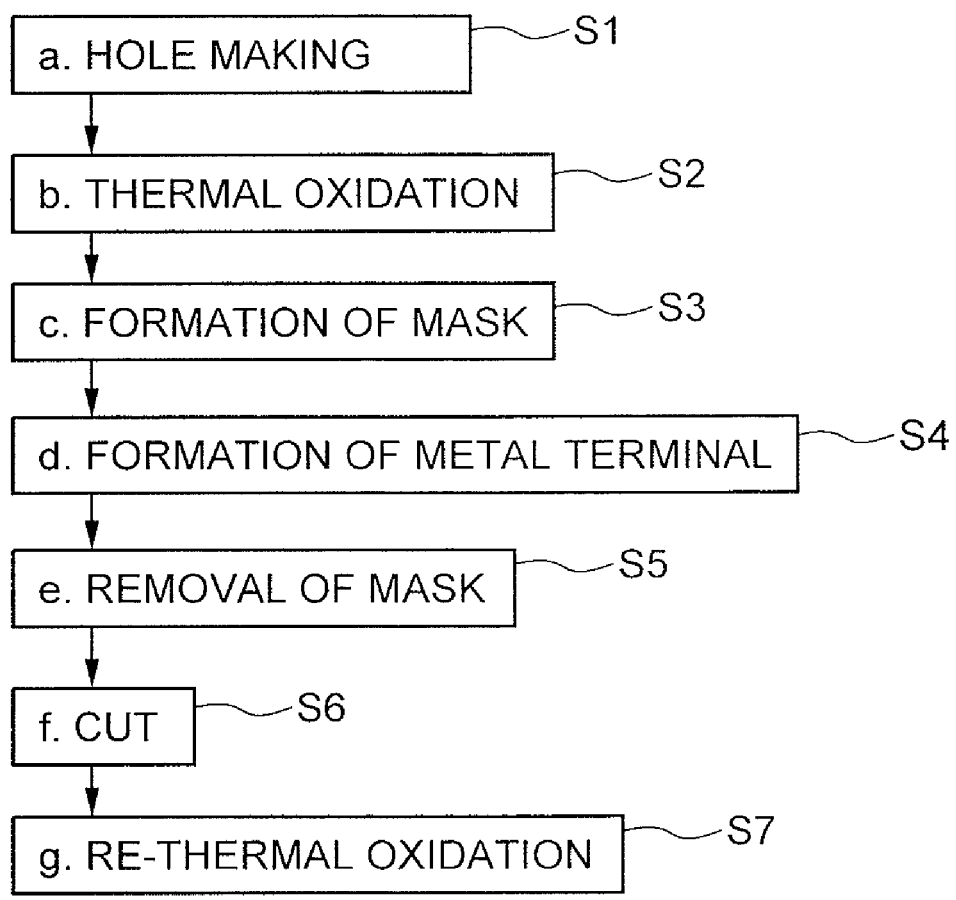
FIG. 8 is a chart showing the manufacturing steps for illustrating a manufacturing method of the spacer according to the exemplary embodiment disclosed in FIG. 1.
Figure 9:
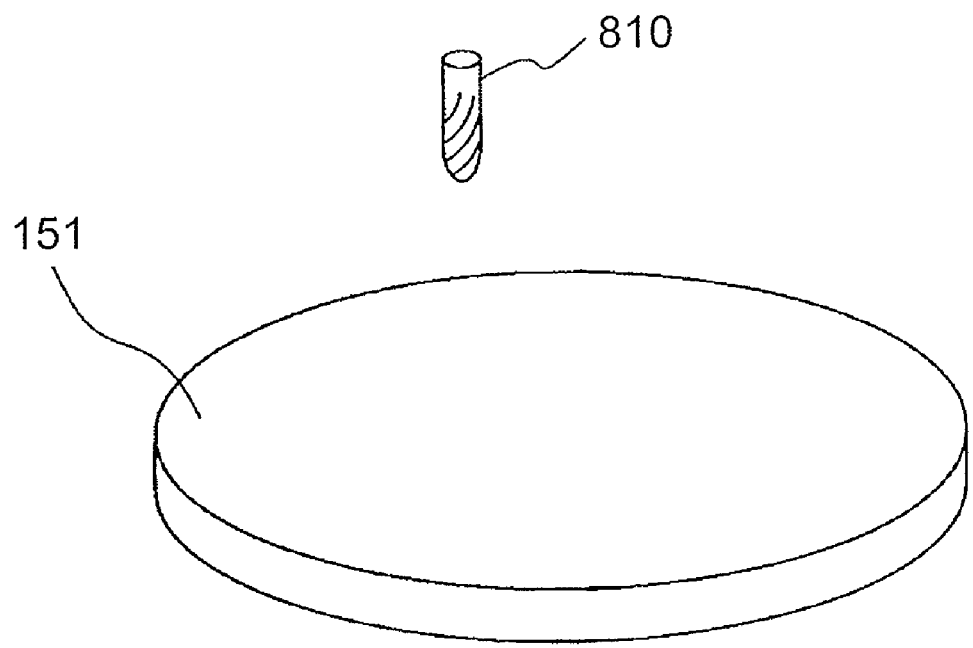
FIG. 9 is a schematic perspective view of a silicon wafer and a pointed tool used in the manufacturing method of the spacer of the exemplary embodiment disclosed in FIG. 1.
Figure 10:
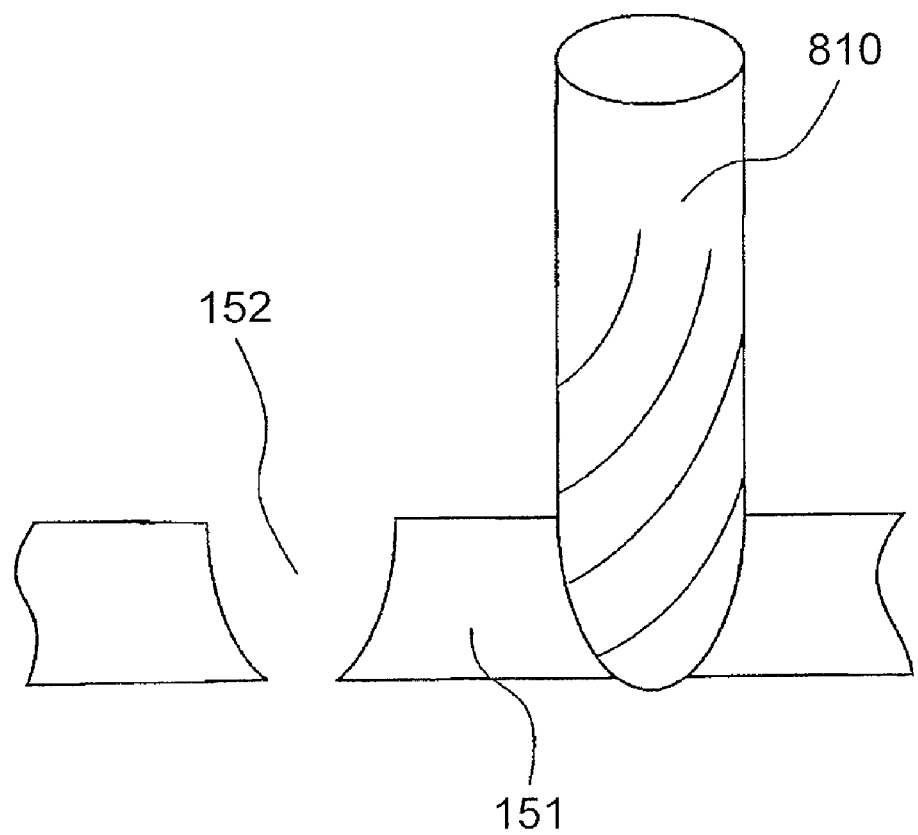
FIG. 10 is an explanatory illustration of a hole making step of the manufacturing method of the spacer according to the exemplary embodiment disclosed in FIG. 1.
Figure 11:
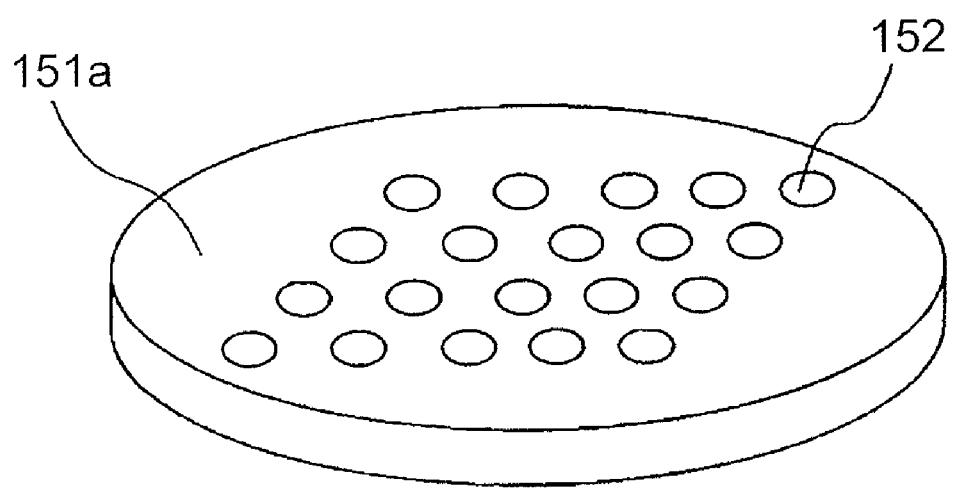
FIG. 11 is a schematic perspective view showing the silicon wafer after executing the hole making step of the manufacturing method of the spacer according to the exemplary embodiment disclosed in FIG. 1.
Figure 12:
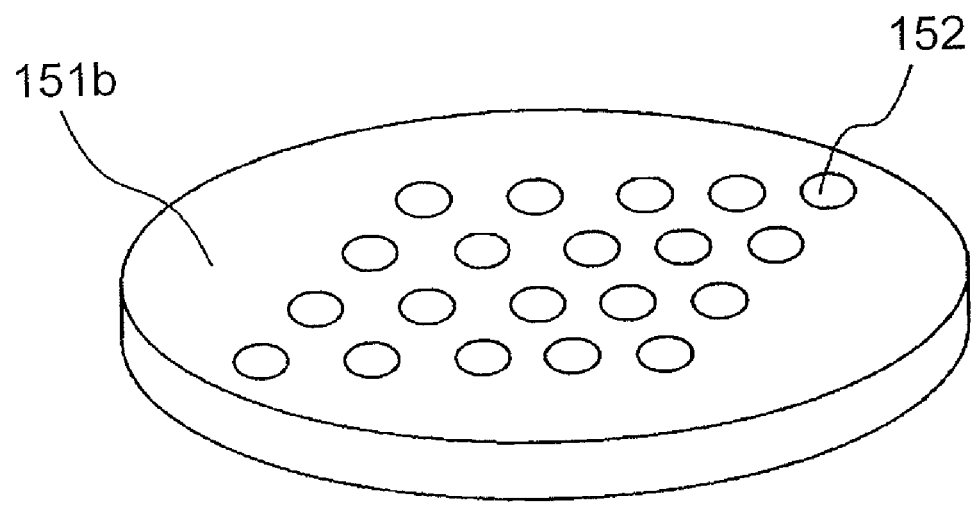
FIG. 12 is a schematic perspective view showing the silicon wafer after executing a thermal oxidation step of the manufacturing method of the spacer according to the exemplary embodiment disclosed in FIG. 1.
Figure 13:
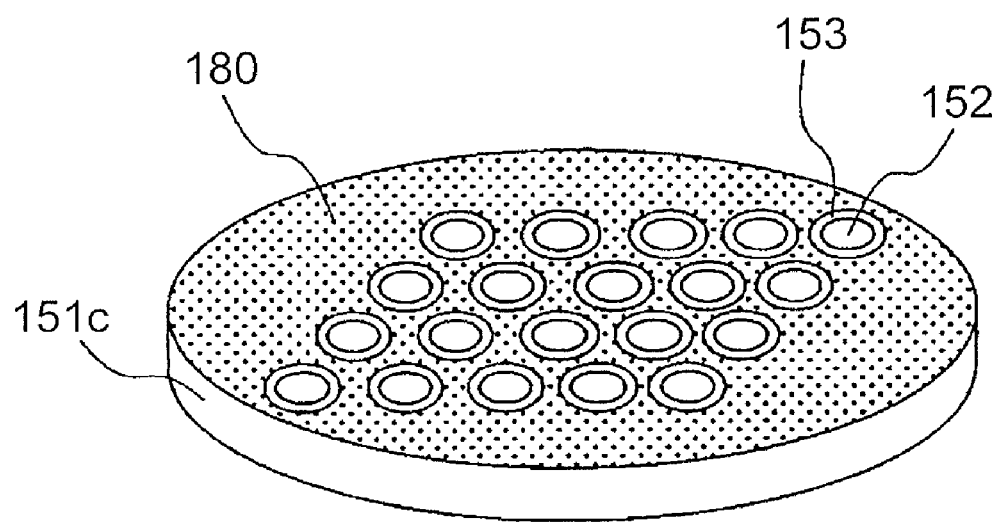
FIG. 13 is a schematic perspective view showing the silicon wafer after executing a mask forming step of the manufacturing method of the spacer according to the exemplary embodiment disclosed in FIG. 1.
Figure 14:
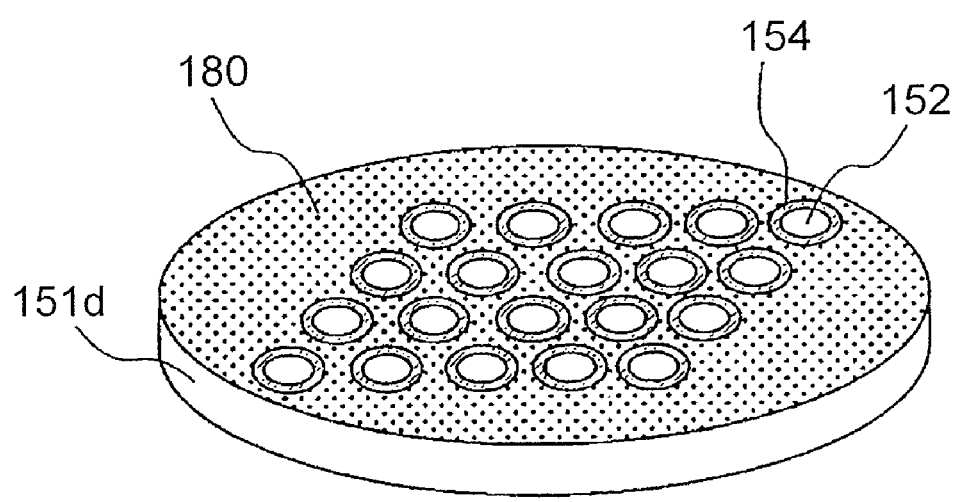
FIG. 14 is a schematic perspective view showing the silicon wafer after executing a metal terminal forming step of the manufacturing method of the spacer according to the exemplary embodiment disclosed in FIG. 1.
Figure 15:
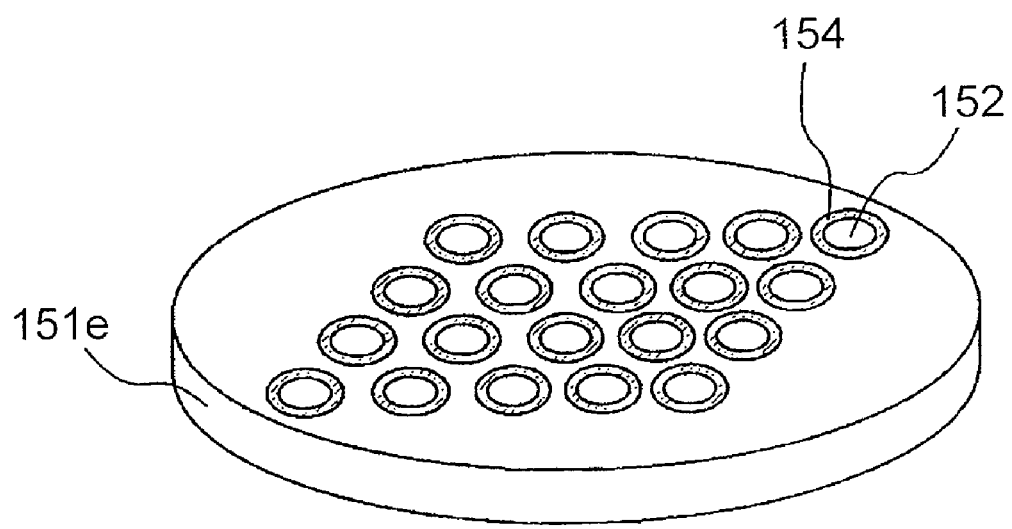
FIG. 15 is a schematic perspective view showing the silicon wafer after executing a mask removing step of the manufacturing method of the spacer according to the exemplary embodiment disclosed in FIG. 1.
Figure 16:
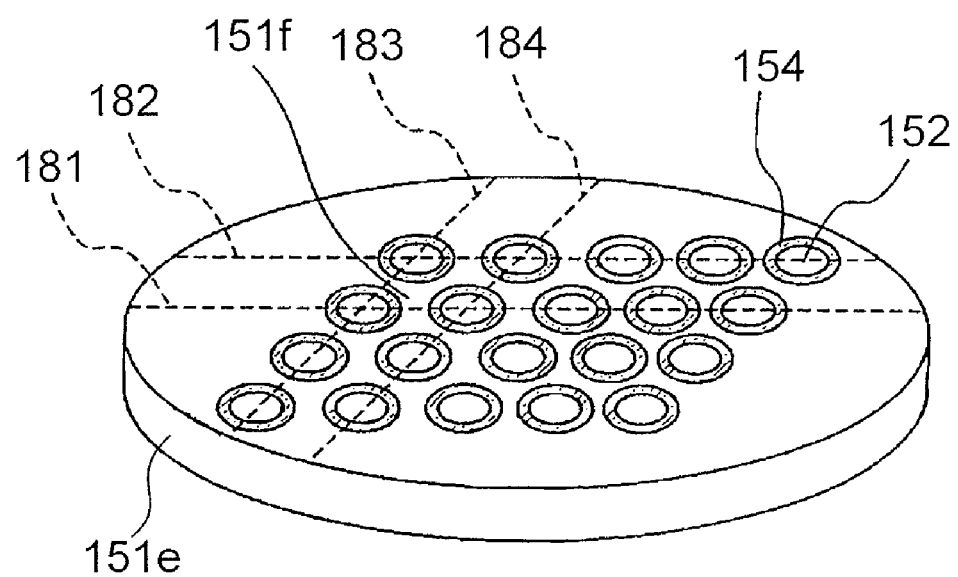
FIG. 16 is an explanatory illustration of a cutting step of the manufacturing method of the spacer according to the exemplary embodiment disclosed in FIG. 1.
Figure 17:
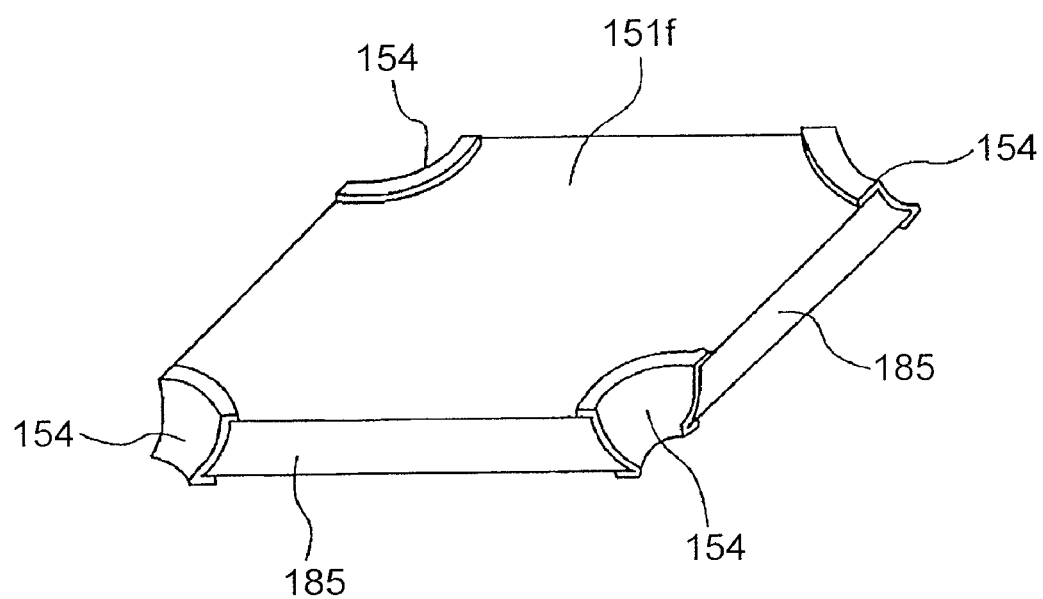
FIG. 17 is a schematic perspective view showing a silicon wafer piece after executing the cutting step of the manufacturing method of the spacer according to the exemplary embodiment disclosed in FIG. 1.
Figure 18:
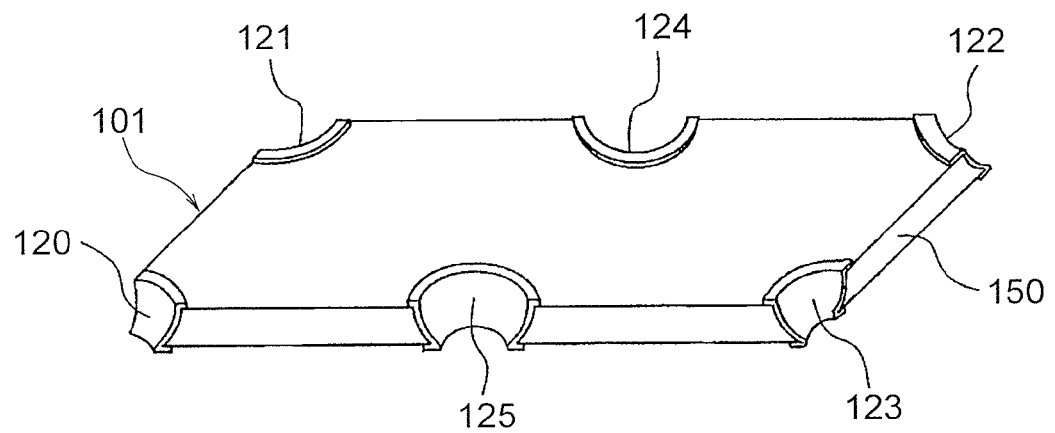
FIG. 18 is a schematic perspective view showing the shape of a spacer according to a second exemplary embodiment of the invention.
Figure 19:
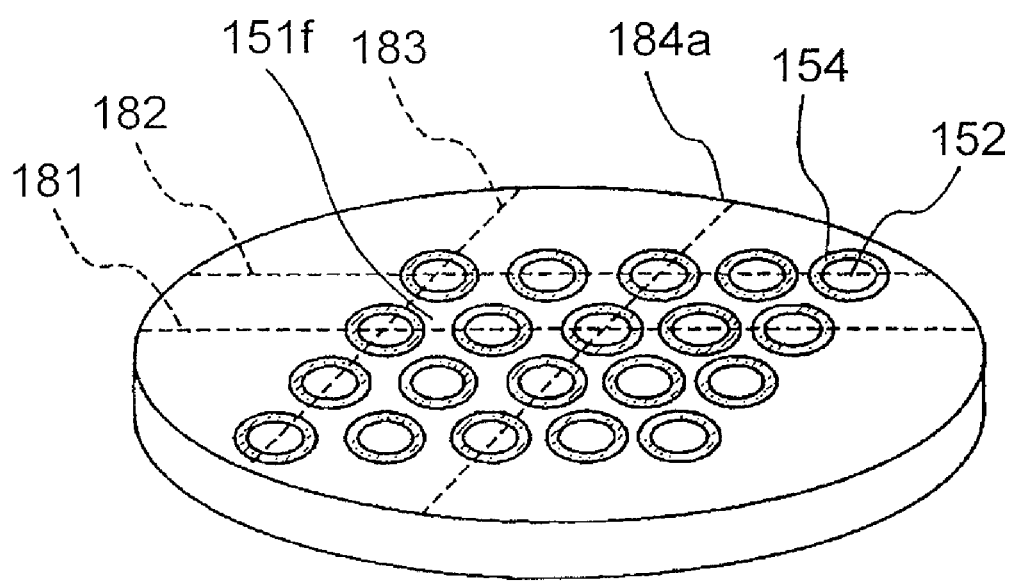
FIG. 19 is an explanatory illustration showing a part of manufacturing steps of the spacer according to the exemplary embodiment disclosed in FIG. 18.
Figure 20:
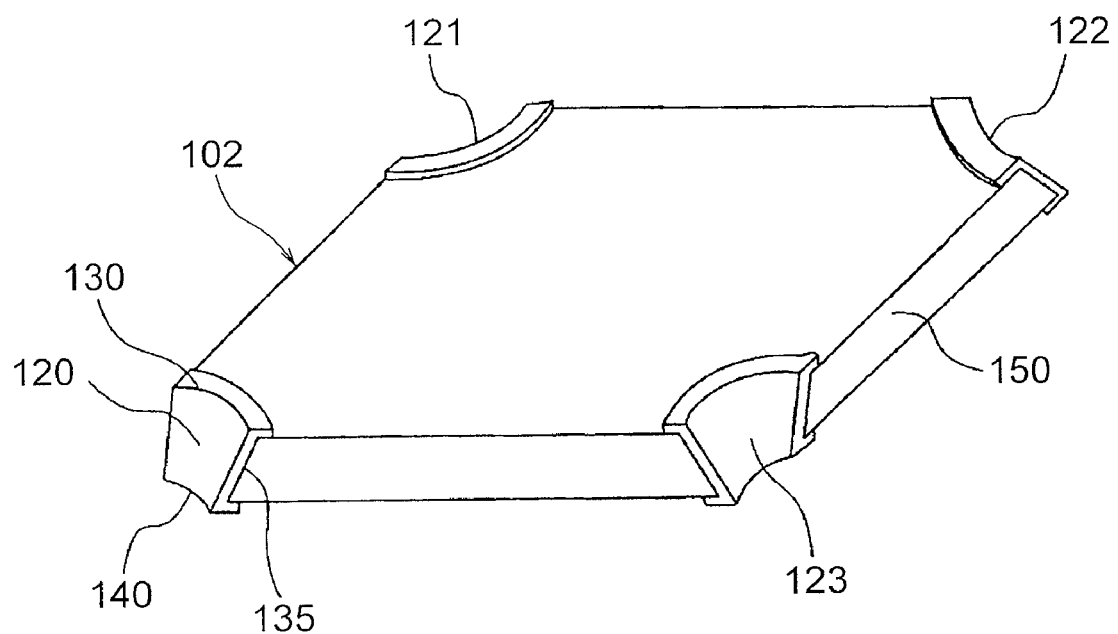
FIG. 20 is a schematic perspective view showing the shape of a spacer according to a third exemplary embodiment of the invention.
Figure 21:
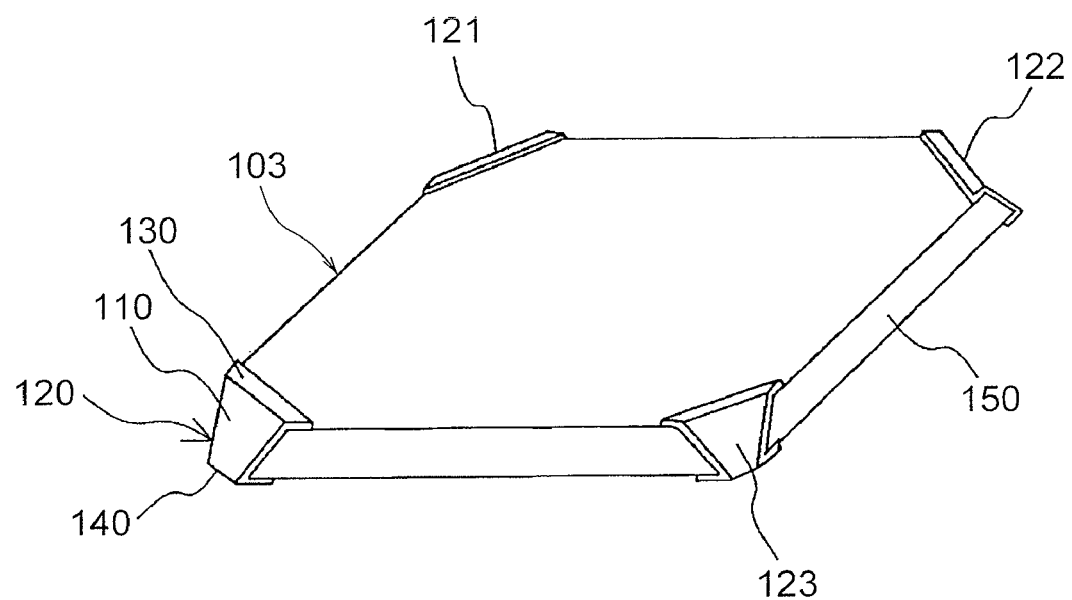
FIG. 21 is a schematic perspective view showing the shape of a spacer according to a fourth exemplary embodiment of the invention.
Figure 22:
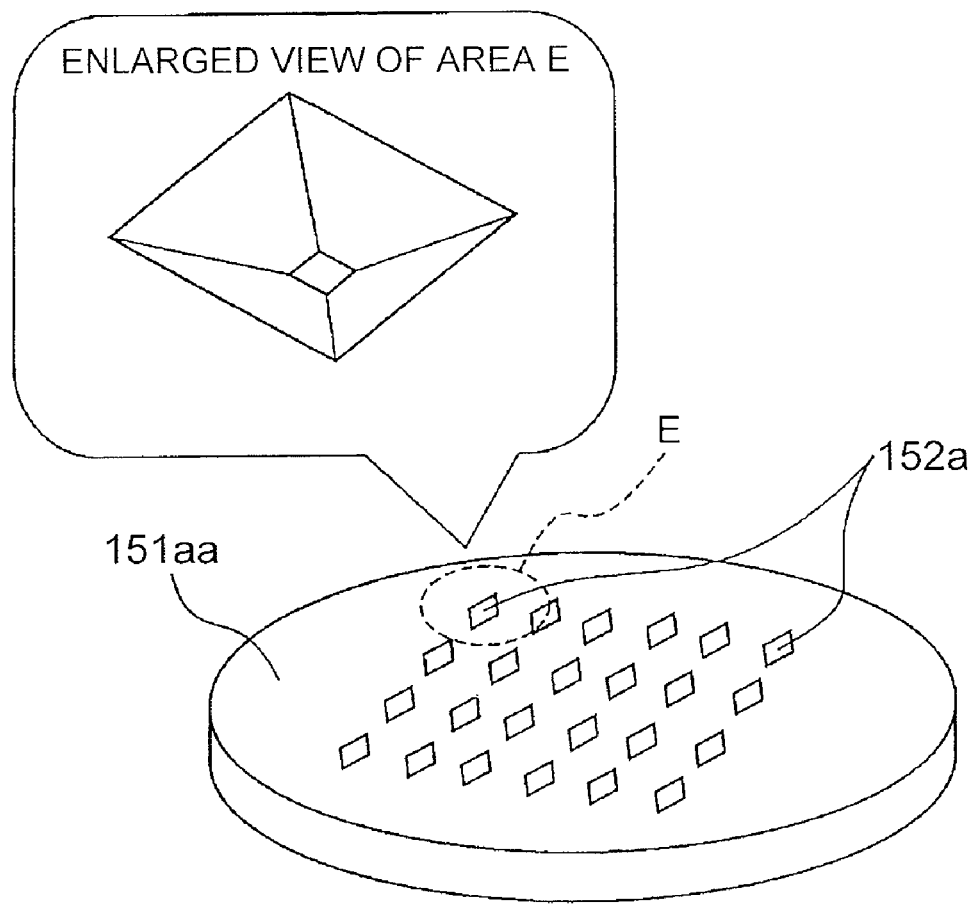
FIG. 22 is an explanatory illustration showing a part of manufacturing steps of the spacer according to the exemplary embodiment disclosed in FIG. 21.
Figure 23:
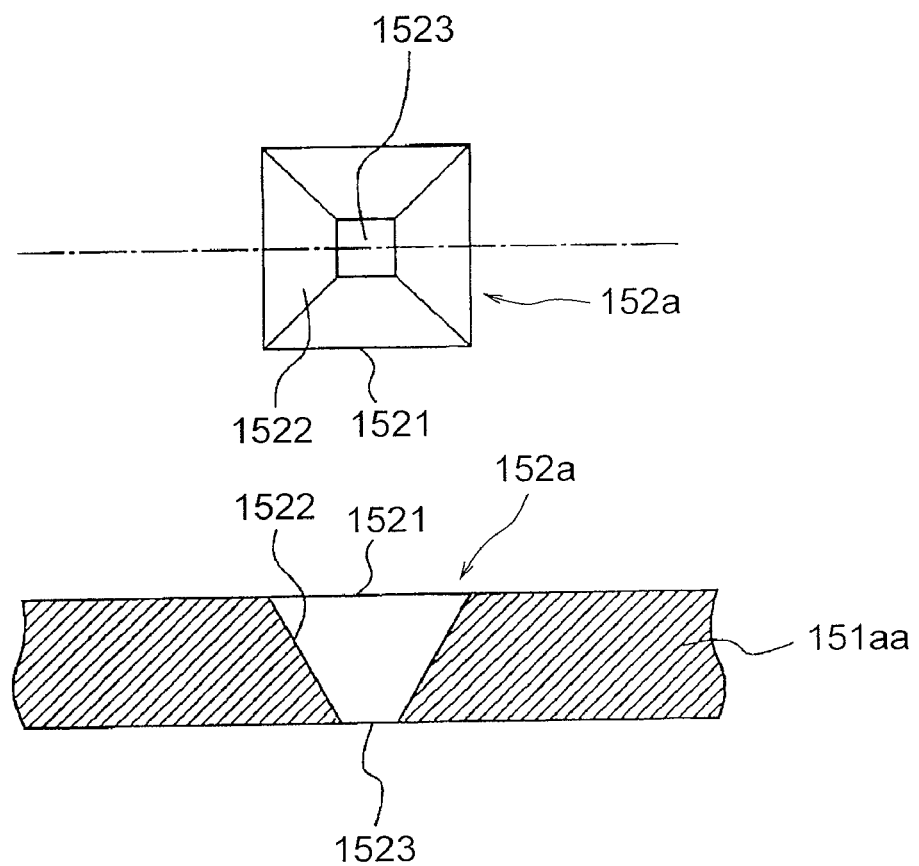
FIG. 23 shows a plan view and a sectional view of a holes shown in FIG. 22.
Figure 24:
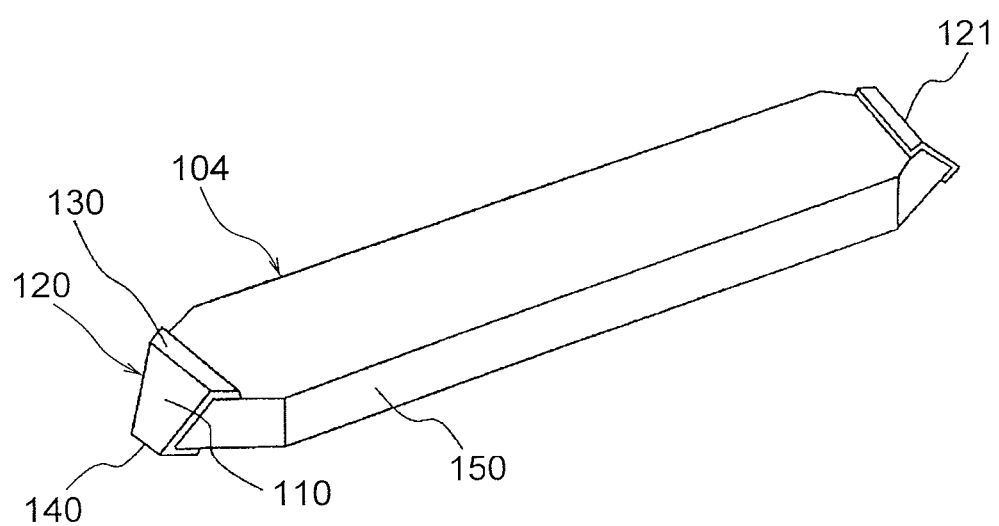
FIG. 24 is a schematic perspective view showing the shape of a spacer according to a fifth exemplary embodiment of the invention.
Figure 25:
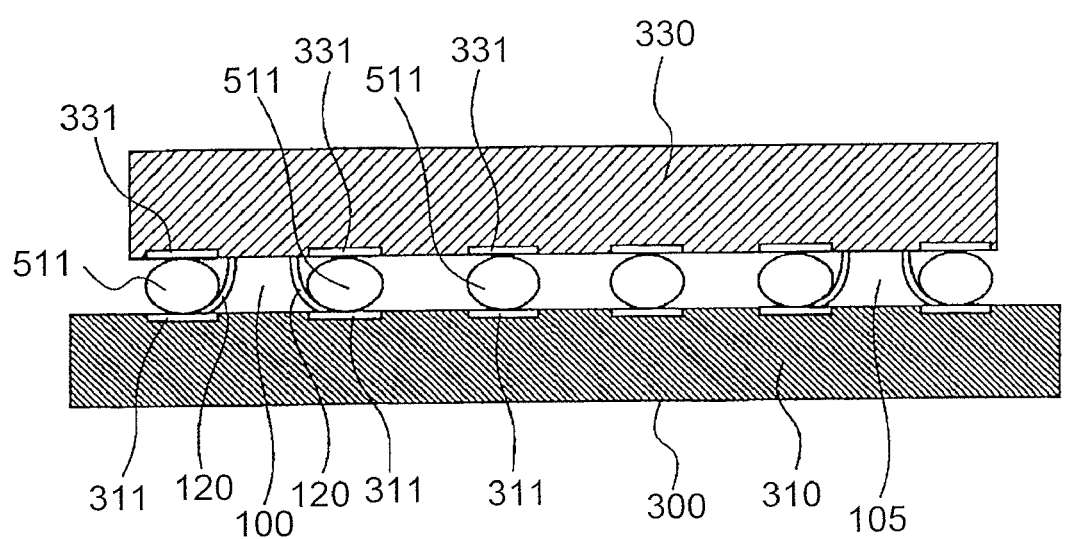
FIG. 25 is a schematic sectional view of an LSI to which the spacer of the exemplary embodiment disclosed in FIG. 1 is mounted.
Figure 26:
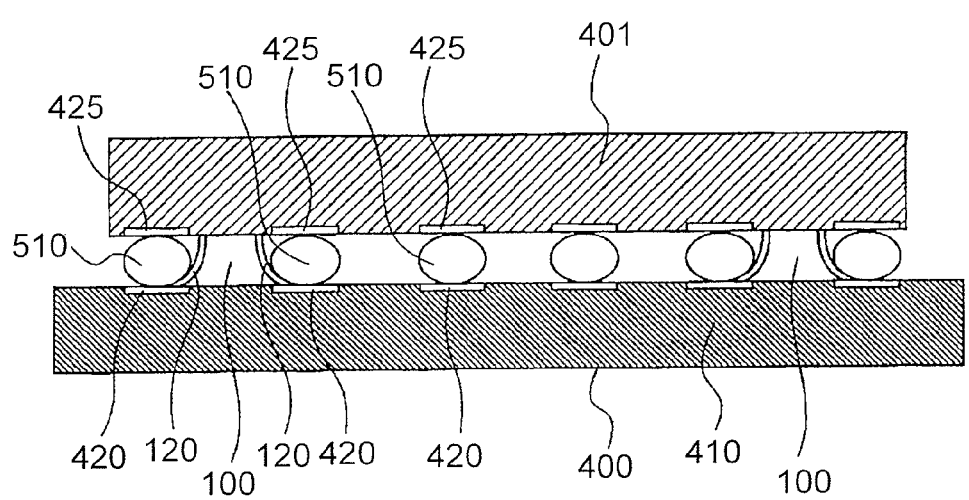
FIG. 26 is a schematic sectional view of a case where the spacer of the exemplary embodiment disclosed in FIG. 1 is mounted between a printed circuit board and a slave board.
Figure 27:
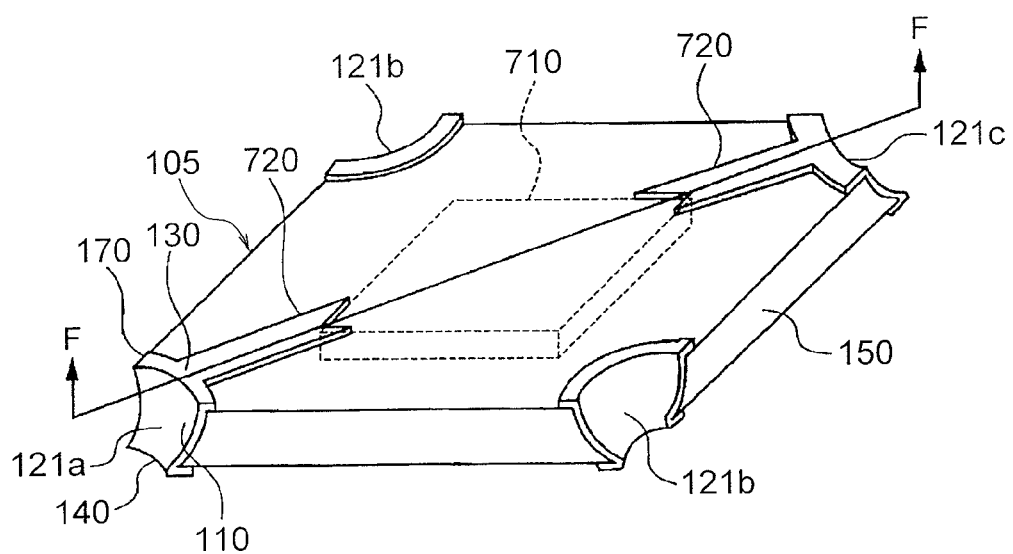
FIG. 27 is a schematic perspective view showing the shape of a spacer according to a sixth exemplary embodiment of the invention.
Figure 28:
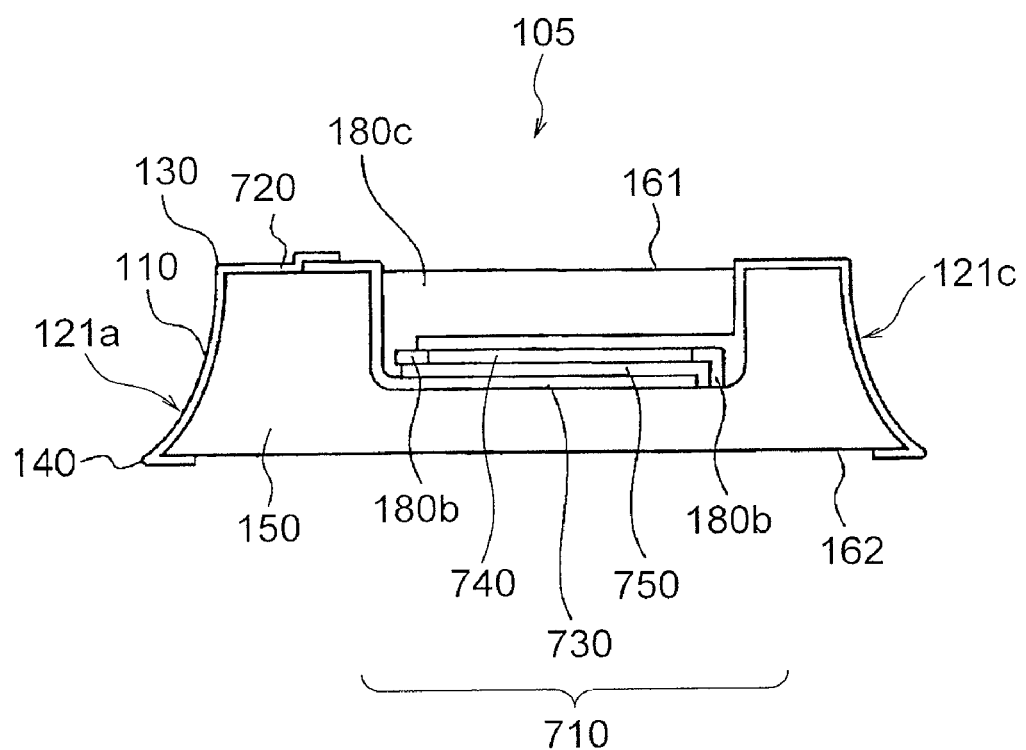
FIG. 28 is a schematic end view taken along the F-F line of the spacer of the exemplary embodiment disclosed in FIG. 27.
Figure 29:
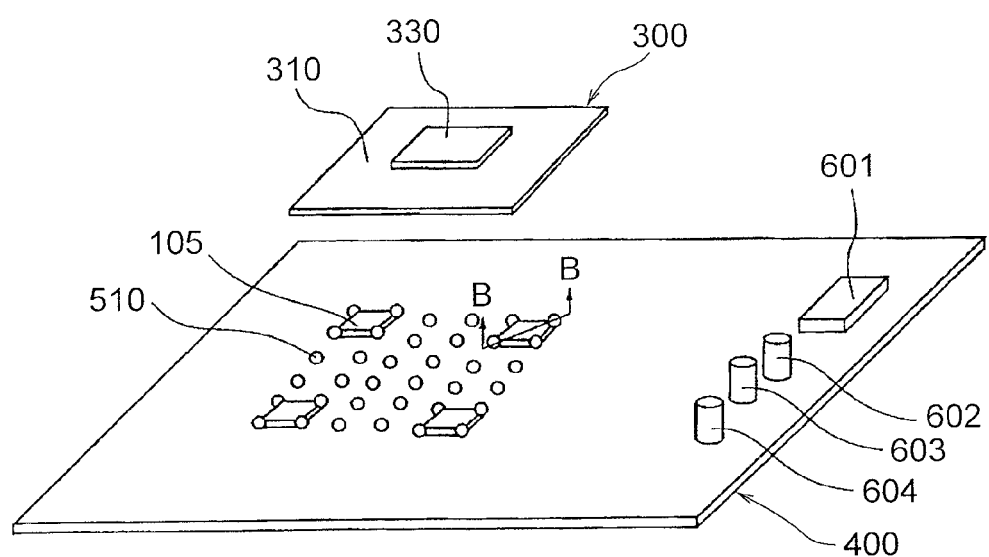
FIG. 29 is a schematic perspective view showing a use example of the spacer of the exemplary embodiment disclosed in FIG. 27.
Figure 30:
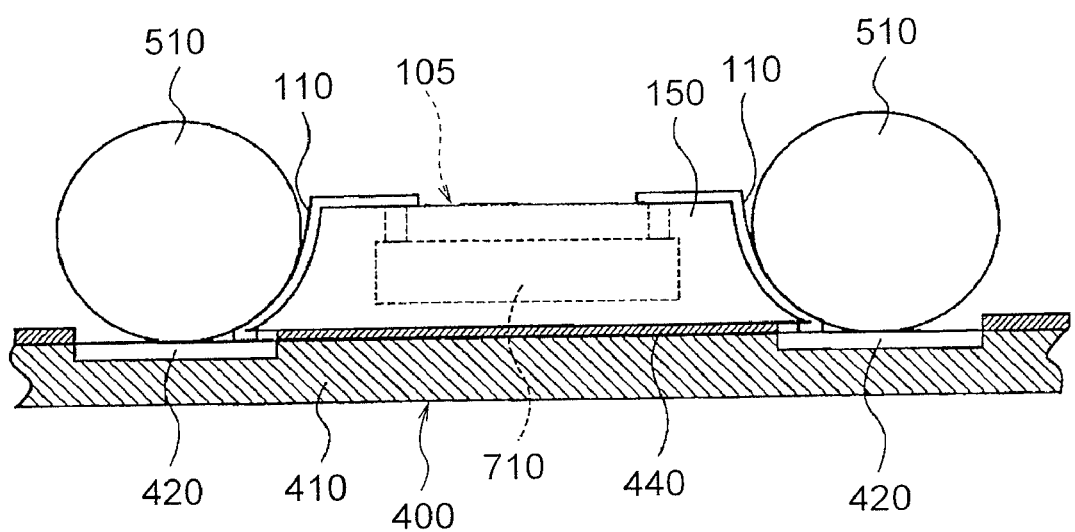
FIG. 30 is a schematic end view taken along the G-G line of FIG. 29.
Figure 31:
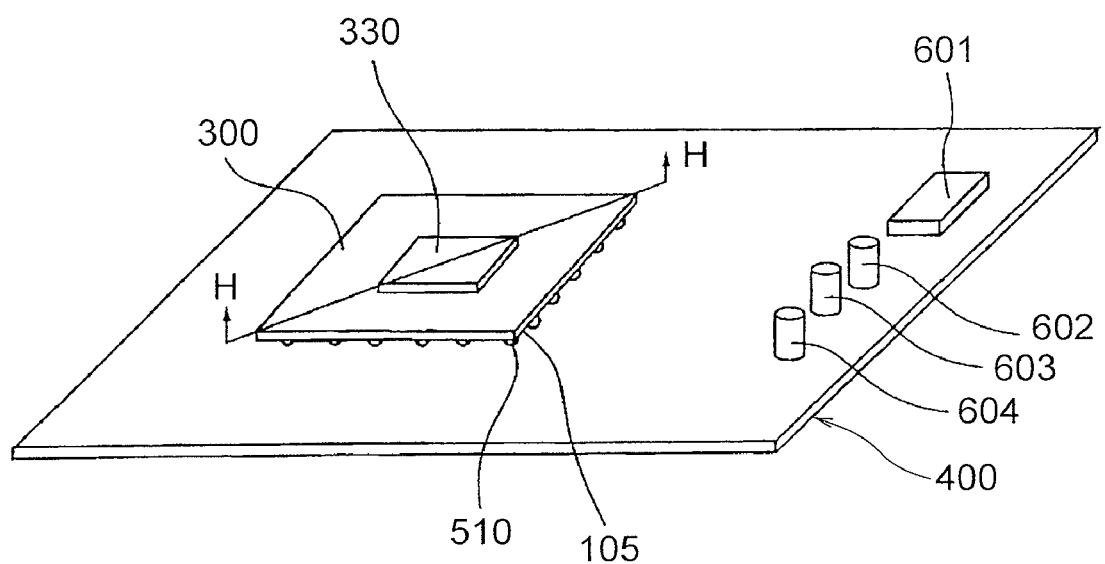
FIG. 31 is a schematic perspective view showing the use example of the spacer of the exemplary embodiment disclosed in FIG. 27.
Figure 32:
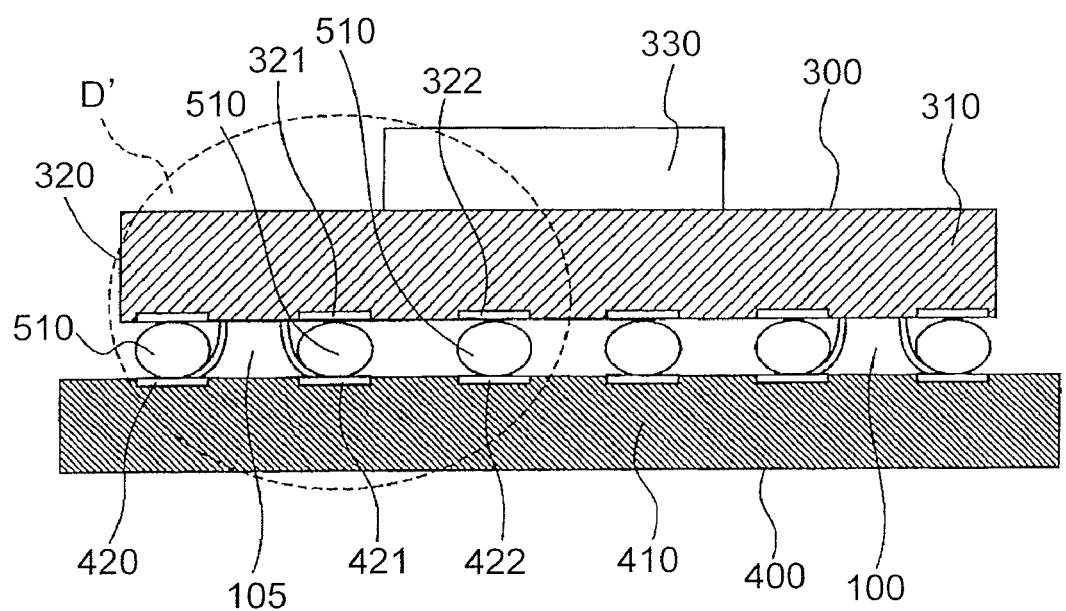
FIG. 32 is a schematic end view taken along the H-H line of FIG. 31.
Figure 33:
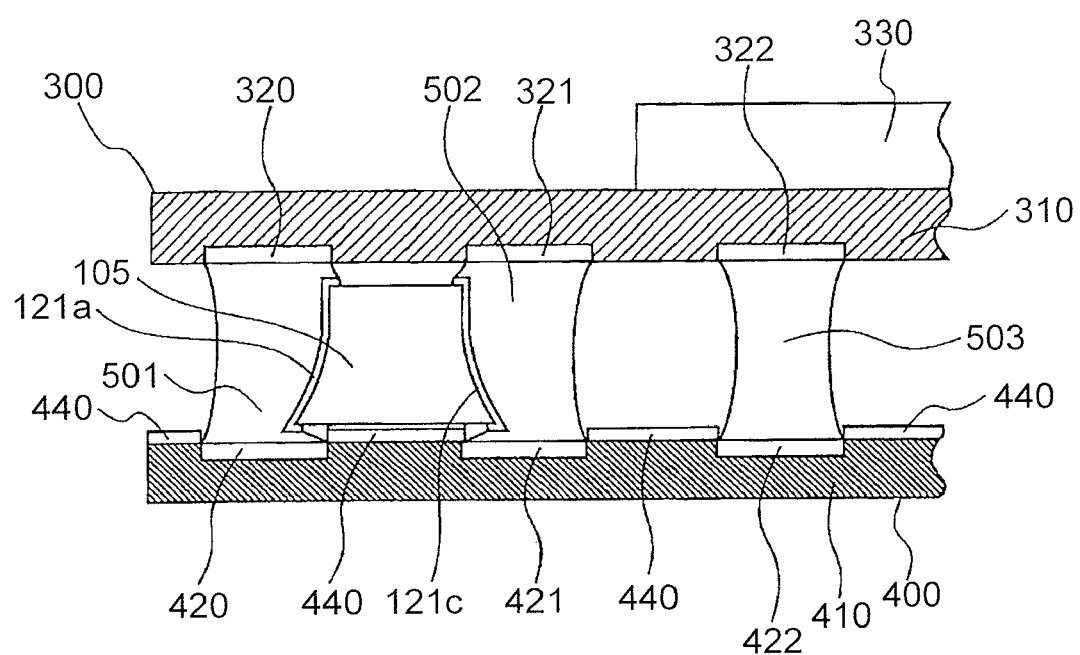
FIG. 33 is a schematic enlarged end view showing a state after soldering an area D' of FIG. 32.
Figure 34:
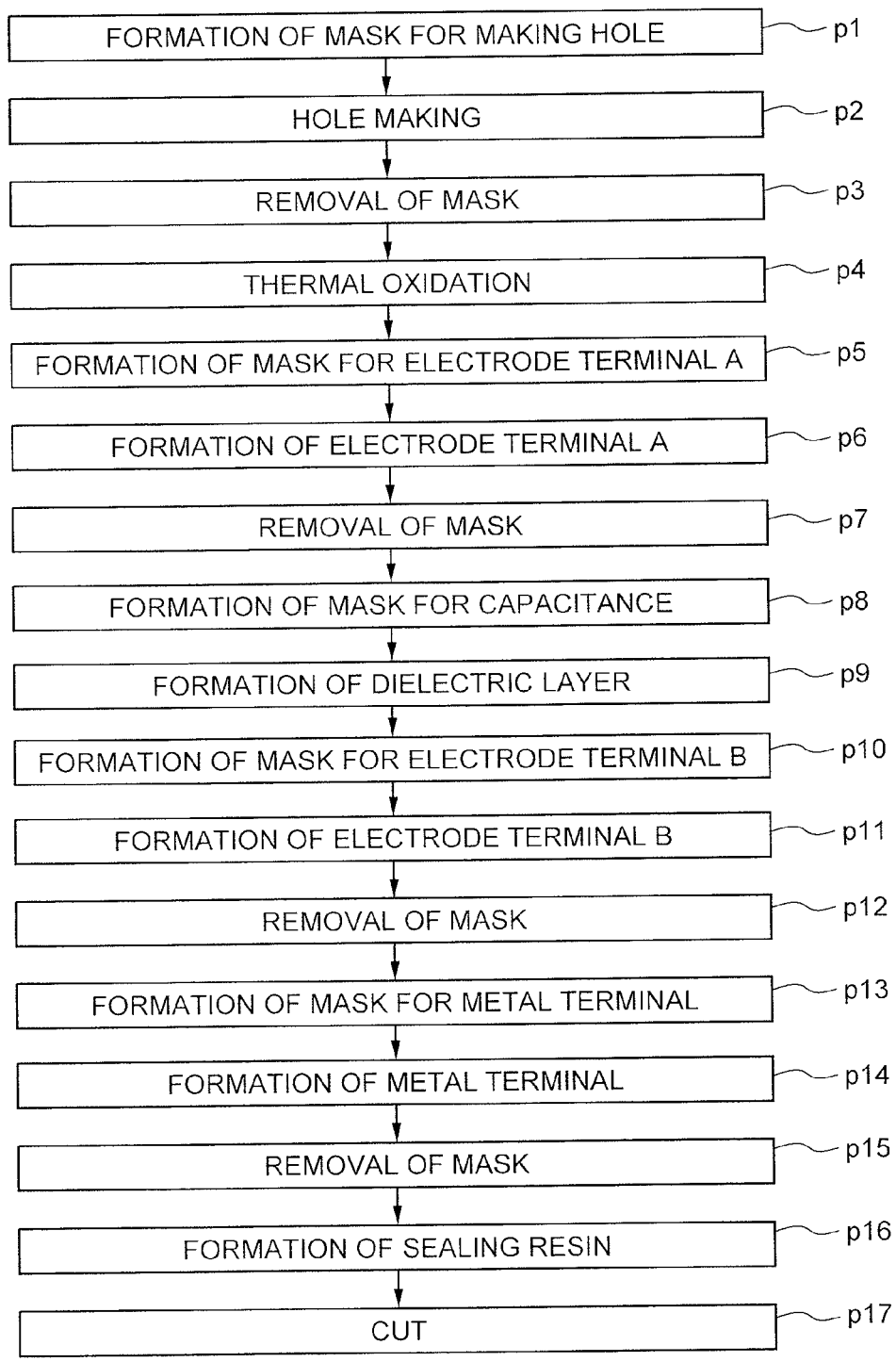
FIG. 34 is a chart showing the manufacturing steps for illustrating a manufacturing method of the spacer according to the exemplary embodiment disclosed in FIG. 27.
Figure 35:
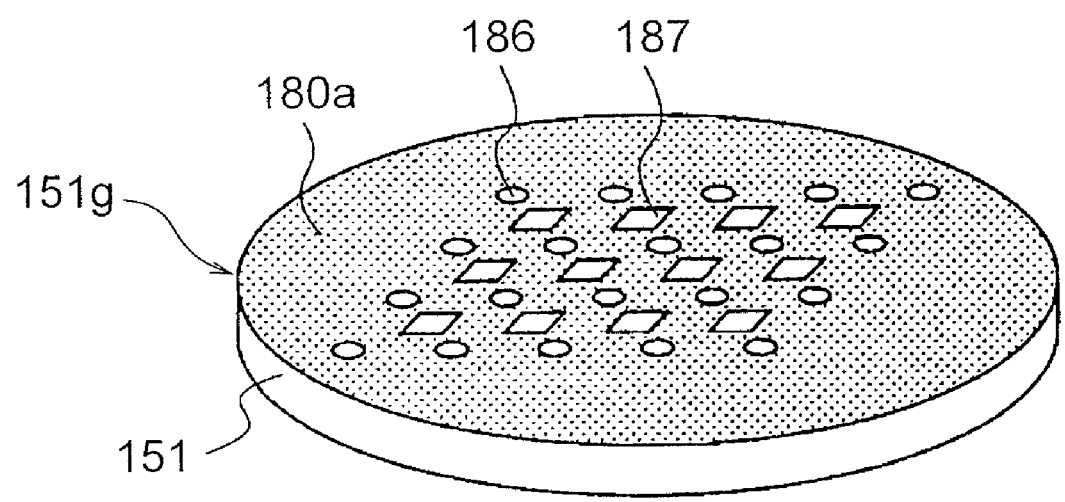
FIG. 35 is a schematic perspective view showing the silicon wafer after executing a hole-making mask forming step of the manufacturing method of the spacer according to the exemplary embodiment disclosed in FIG. 27.
Figure 36:
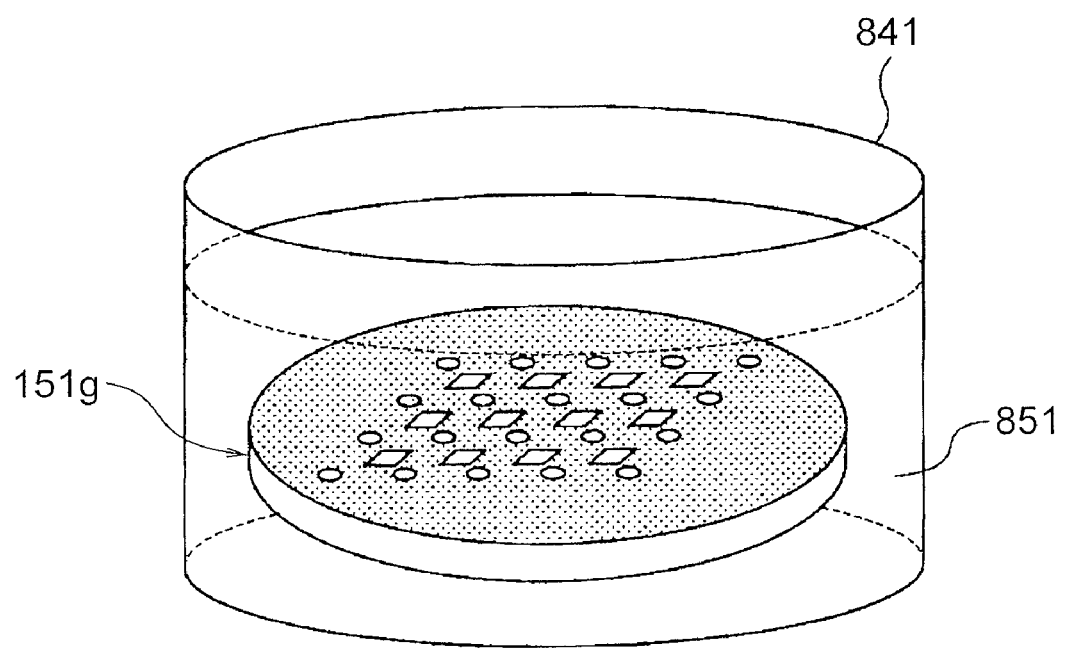
FIG. 36 is an explanatory illustration of a hole making step of the manufacturing method of the spacer according to the exemplary embodiment disclosed in FIG. 27.
Figure 37:
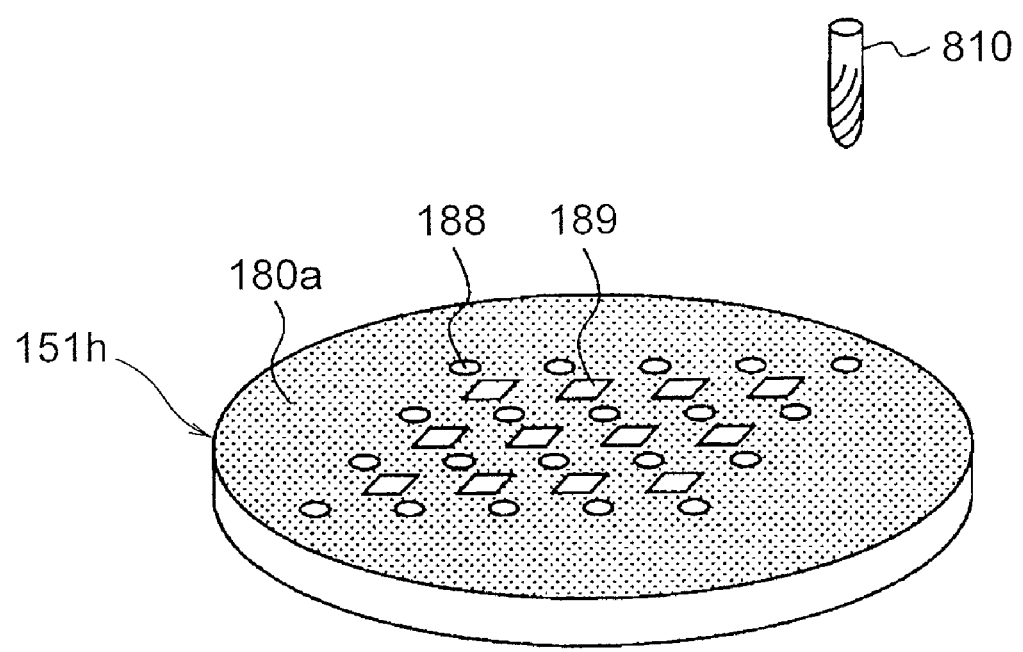
FIG. 37 is a schematic perspective view of a silicon wafer and a pointed tool used in the hole making step of the manufacturing method of the spacer according to the exemplary embodiment disclosed in FIG. 27.
Figure 38:
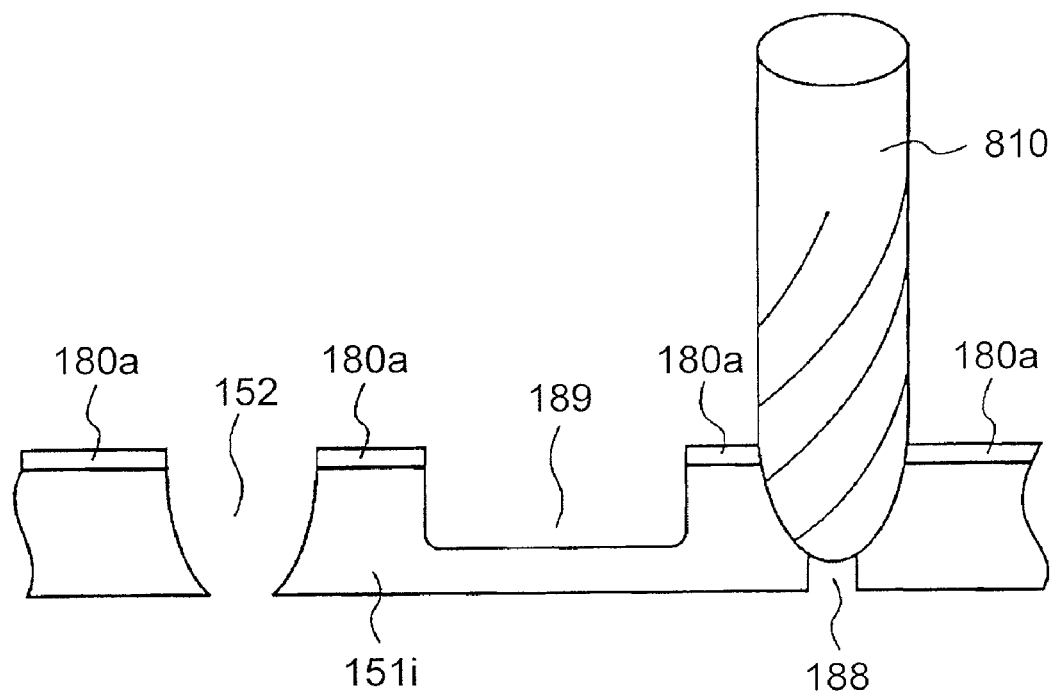
FIG. 38 is an explanatory illustration of the hole making step of the manufacturing method of the spacer according to the exemplary embodiment disclosed in FIG. 27.
Figure 39:
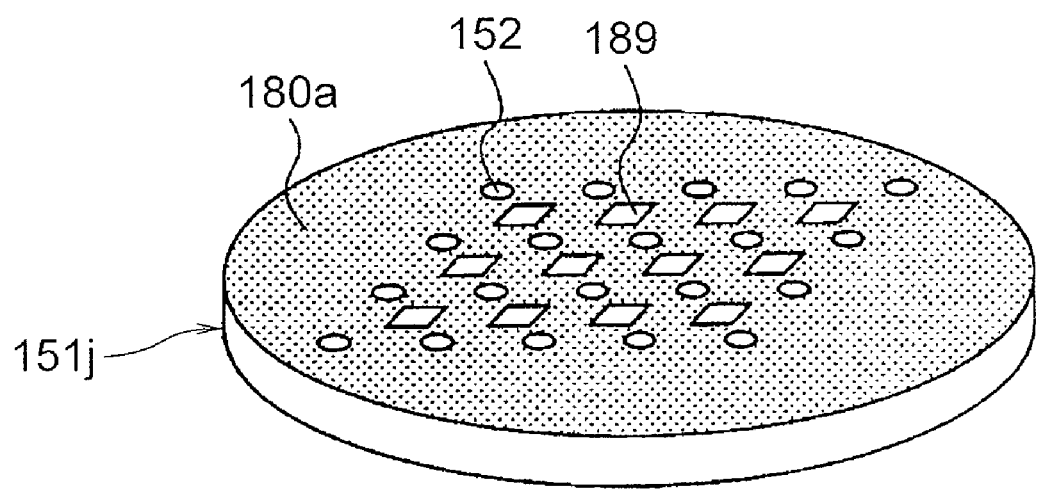
FIG. 39 is a schematic perspective view showing the silicon wafer after executing the hole making step of the manufacturing method of the spacer according to the exemplary embodiment disclosed in FIG. 27.
Figure 40:
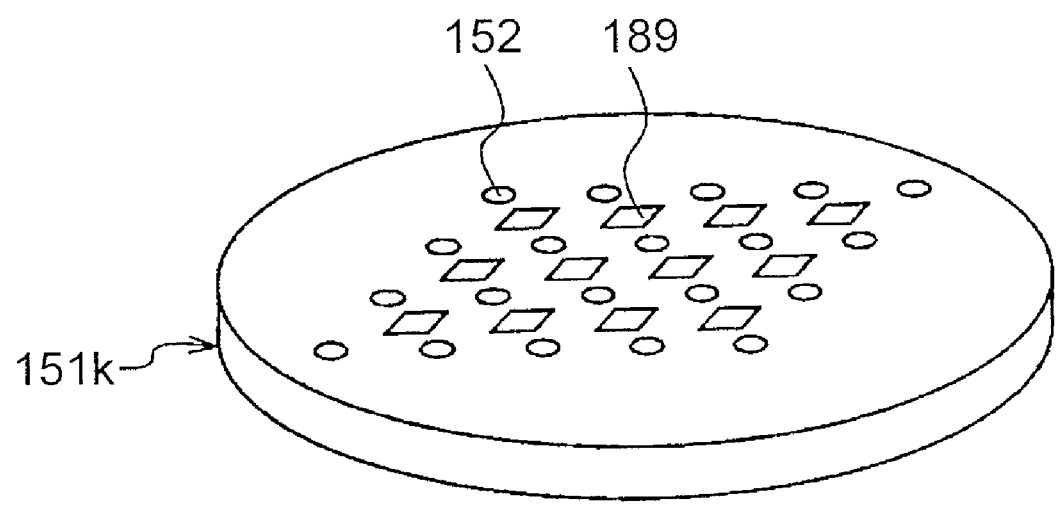
FIG. 40 is a schematic perspective view showing the silicon wafer after executing a mask removing step of the manufacturing method of the spacer according to the exemplary embodiment disclosed in FIG. 27.
Figure 41:
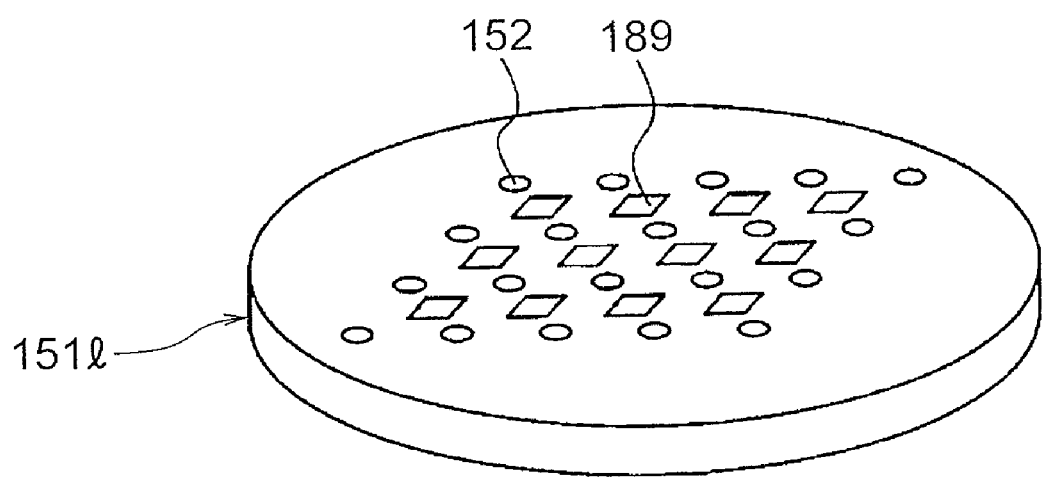
FIG. 41 is a schematic perspective view showing the silicon wafer after executing a thermal oxidation step of the manufacturing method of the spacer according to the exemplary embodiment disclosed in FIG. 27.
Figure 42:
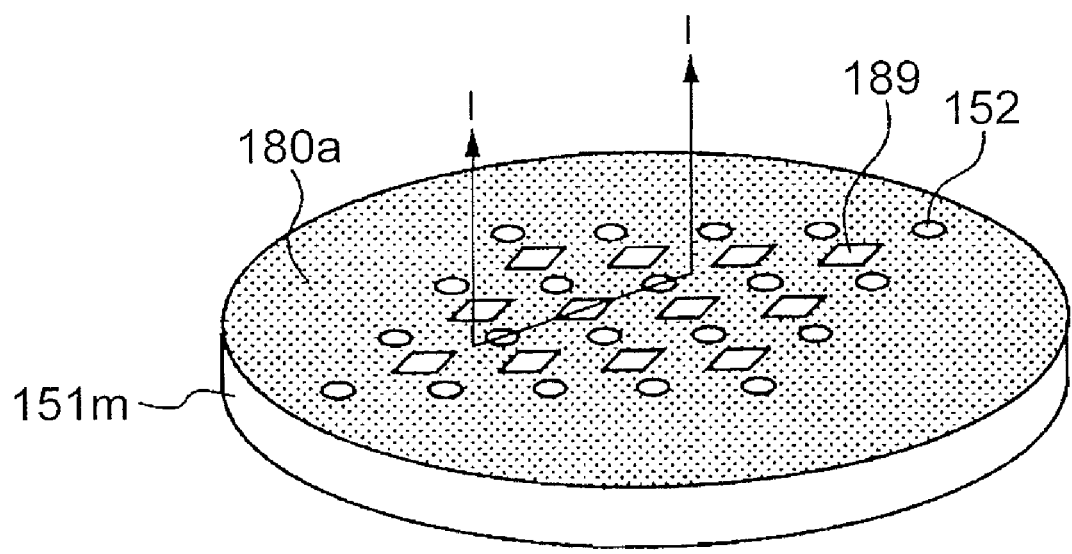
FIG. 42 is a schematic perspective view showing the silicon wafer after executing a mask forming step for an electrode terminal A in the manufacturing method of the spacer according to the exemplary embodiment disclosed in FIG. 27.
Figure 43:
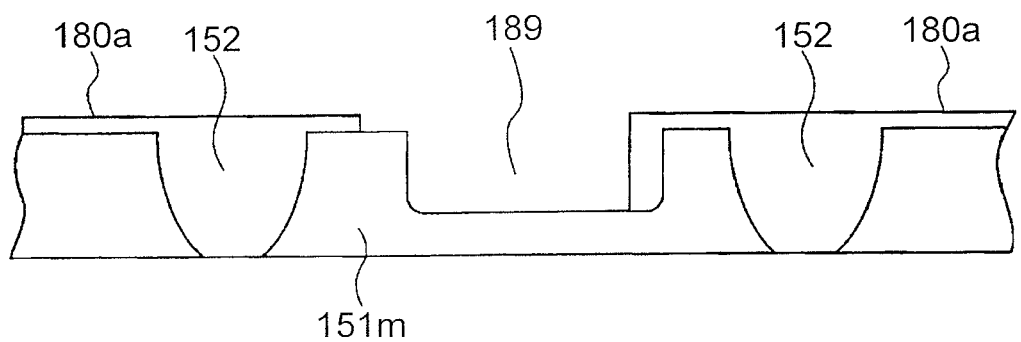
FIG. 43 is a schematic end view taken along the I-I line of FIG. 42.
Figure 44:
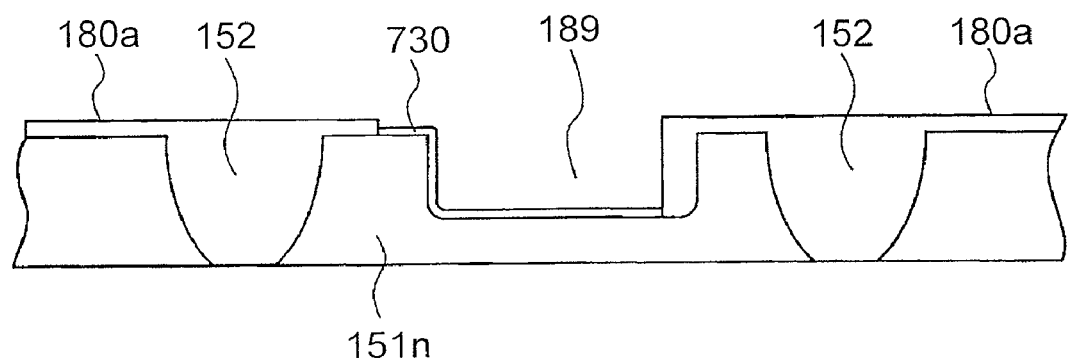
FIG. 44 is a schematic end view showing the silicon wafer after executing an electrode terminal A forming step in the manufacturing method of the spacer according to the exemplary embodiment disclosed in FIG. 27.
Figure 45:
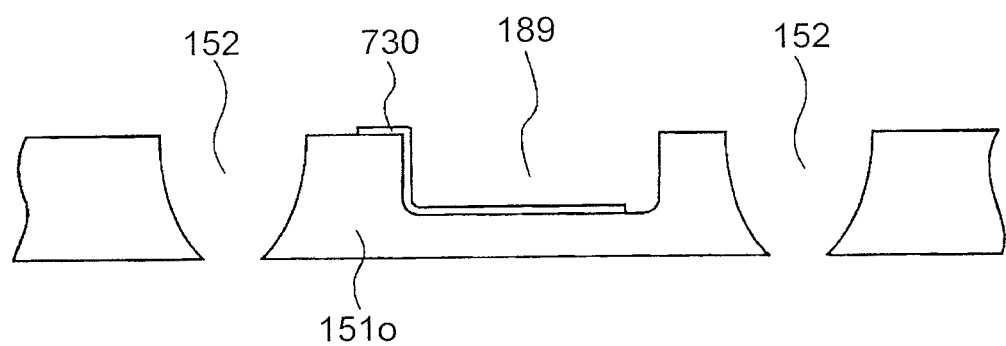
FIG. 45 is a schematic end view showing the silicon wafer after executing a mask removing step of the manufacturing method of the spacer according to the exemplary embodiment disclosed in FIG. 27.
Figure 46:
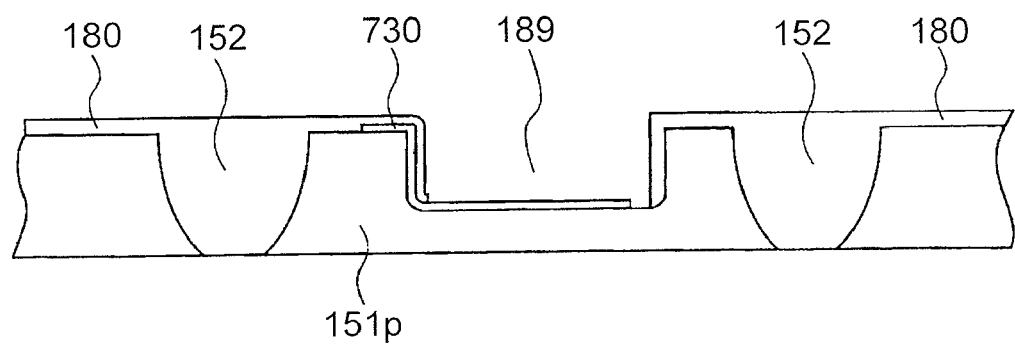
FIG. 46 is a schematic end view showing the silicon wafer after executing a capacitance mask forming step of the manufacturing method of the spacer according to the exemplary embodiment disclosed in FIG. 27.
Figure 47:
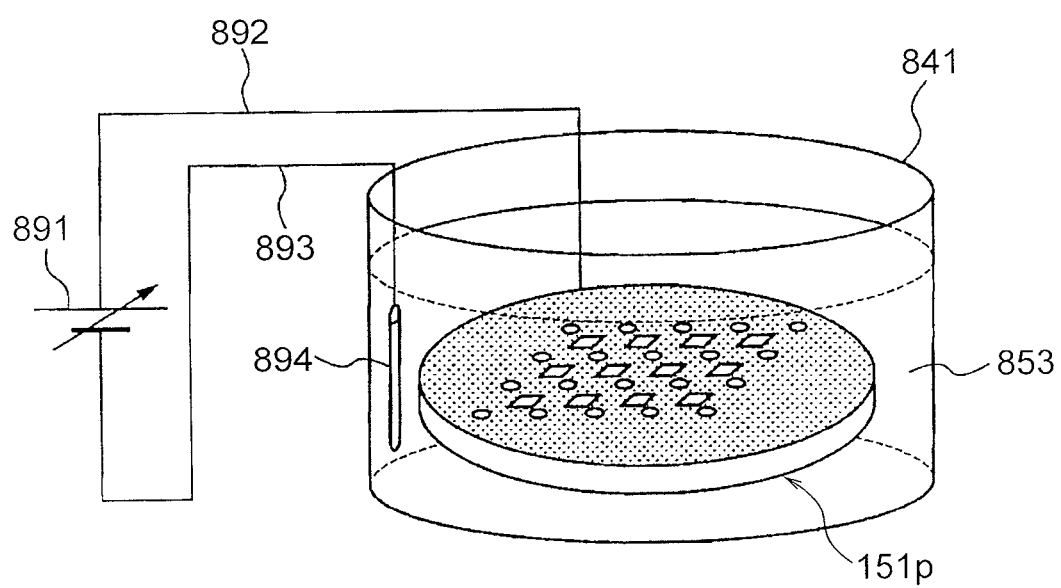
FIG. 47 is an explanatory illustration of a dielectric layer forming step of the manufacturing method of the spacer according to the exemplary embodiment disclosed in FIG. 27.
Figure 48:
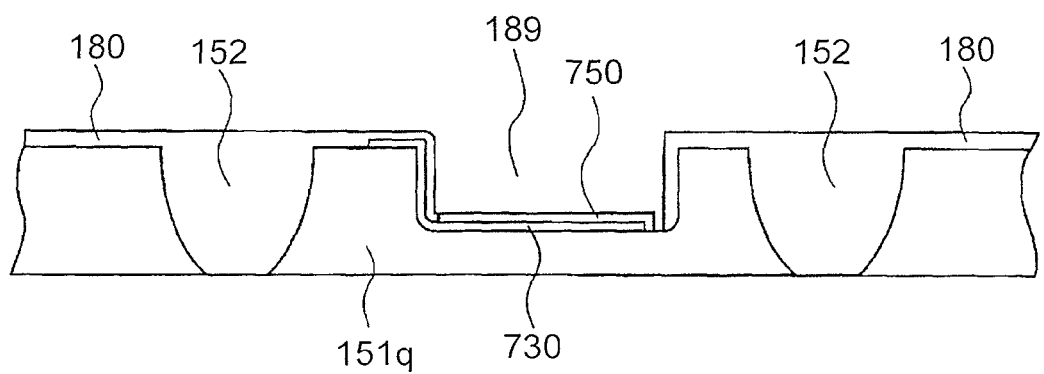
FIG. 48 is a schematic end view showing the silicon wafer after executing a dielectric layer forming step of the manufacturing method of the spacer according to the exemplary embodiment disclosed in FIG. 27.
Figure 49:
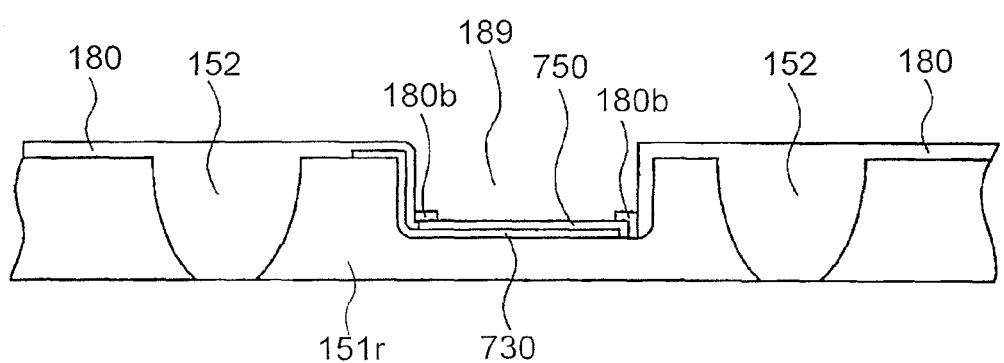
FIG. 49 is a schematic end view showing the silicon wafer after executing a mask forming step for an electrode terminal B in the manufacturing method of the spacer according to the exemplary embodiment disclosed in FIG. 27.
Figure 50:
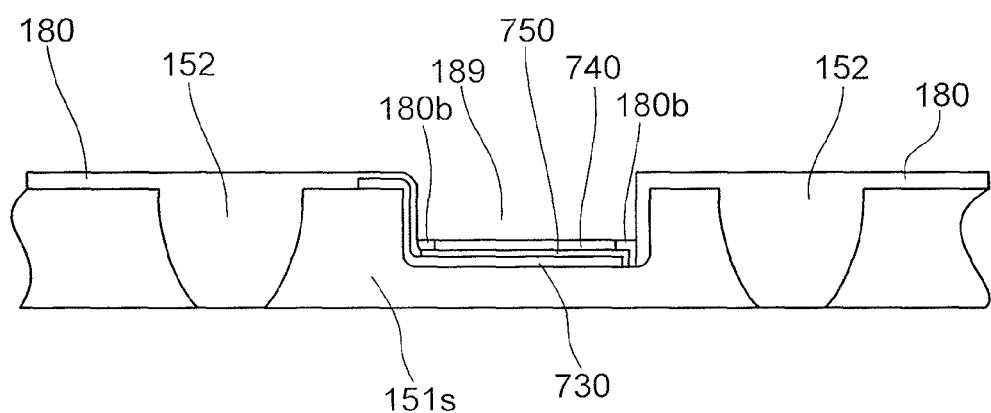
FIG. 50 is a schematic end view showing the silicon wafer after executing an electrode terminal B forming step in the manufacturing method of the spacer according to the exemplary embodiment disclosed in FIG. 27.
Figure 51:
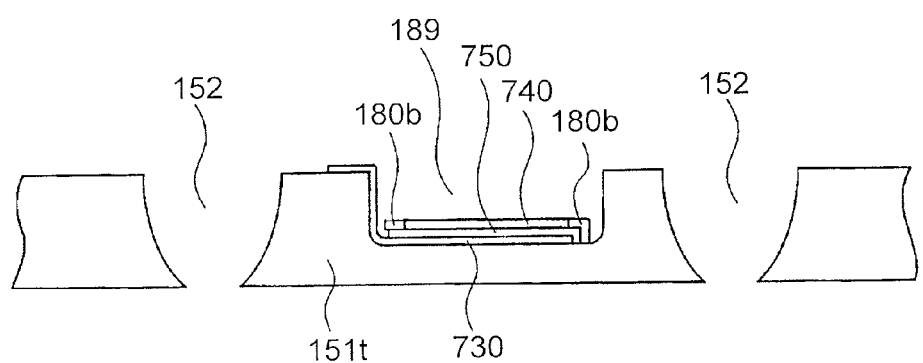
FIG. 51 is a schematic end view showing the silicon wafer after executing a mask removing step of the manufacturing method of the spacer according to the exemplary embodiment disclosed in FIG. 27.
Figure 52:
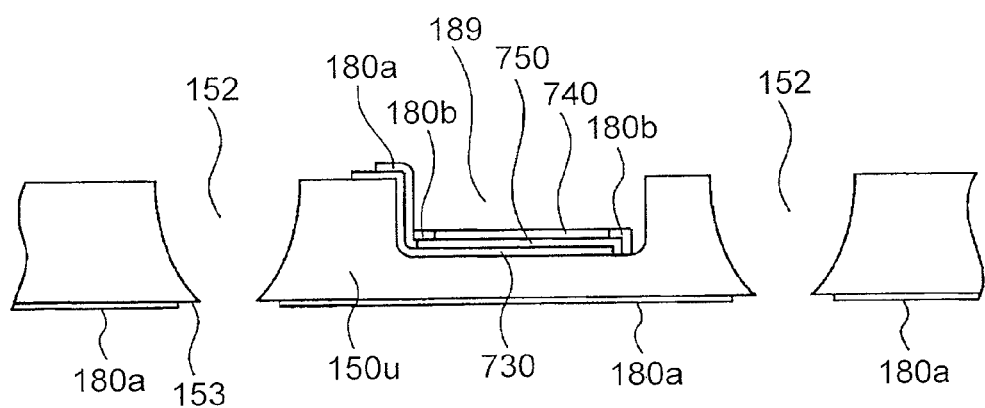
FIG. 52 is a schematic end view showing the silicon wafer after executing a mask forming step for an metal terminal of the manufacturing method of the spacer according to the exemplary embodiment disclosed in FIG. 27.
Figure 53:
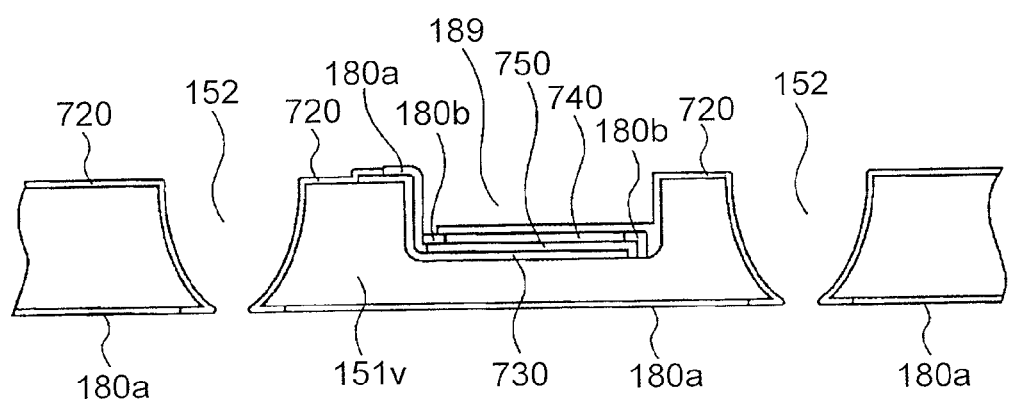
FIG. 53 is a schematic end view showing the silicon wafer after executing the metal terminal forming step of the manufacturing method of the spacer according to the exemplary embodiment disclosed in FIG. 27.
Figure 54:
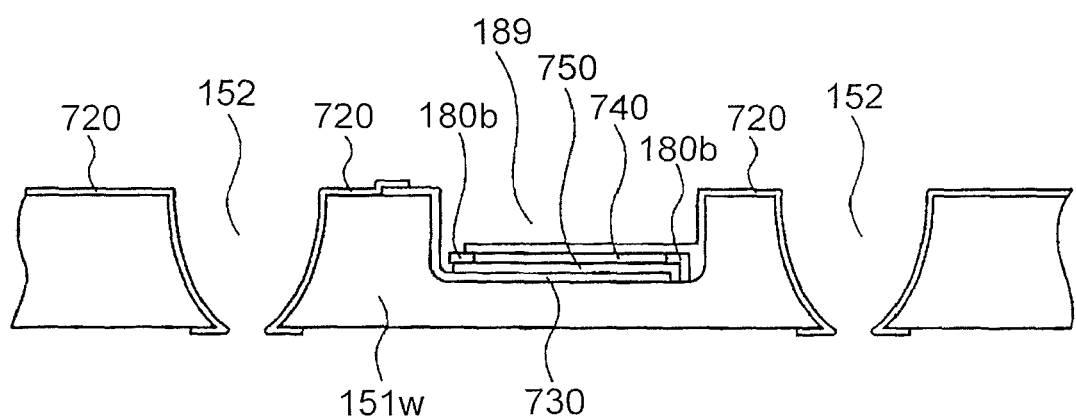
FIG. 54 is a schematic end view showing the silicon wafer after executing a mask removing step of the manufacturing method of the spacer according to the exemplary embodiment disclosed in FIG. 27.
Figure 55:
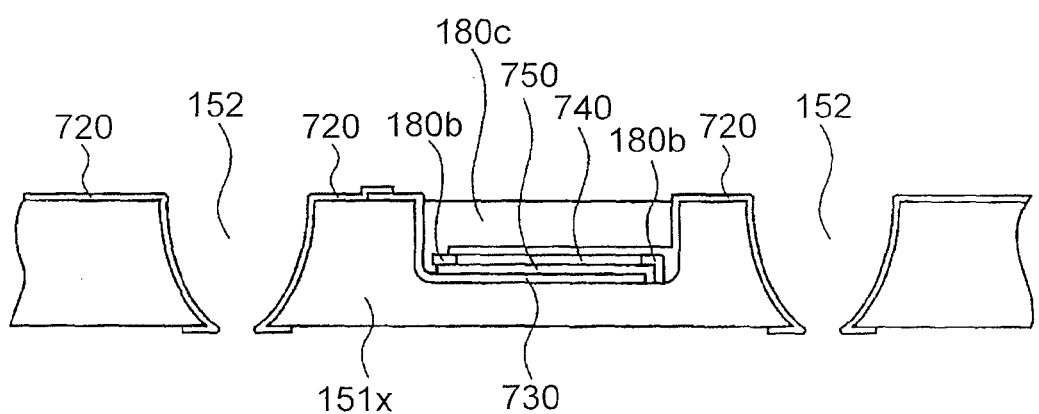
FIG. 55 is a schematic end view showing the silicon wafer after executing a sealing resin forming step of the manufacturing method of the spacer according to the exemplary embodiment disclosed in FIG. 27.
Figure 56:
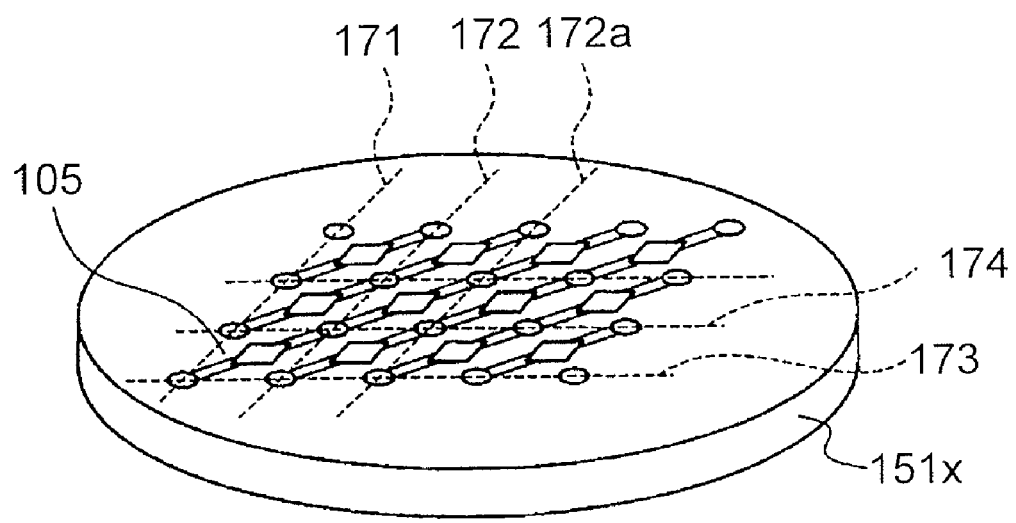
FIG. 56 is an explanatory illustration of a cutting step of the manufacturing method of the spacer according to the exemplary embodiment disclosed in FIG. 27.
Figure 57:
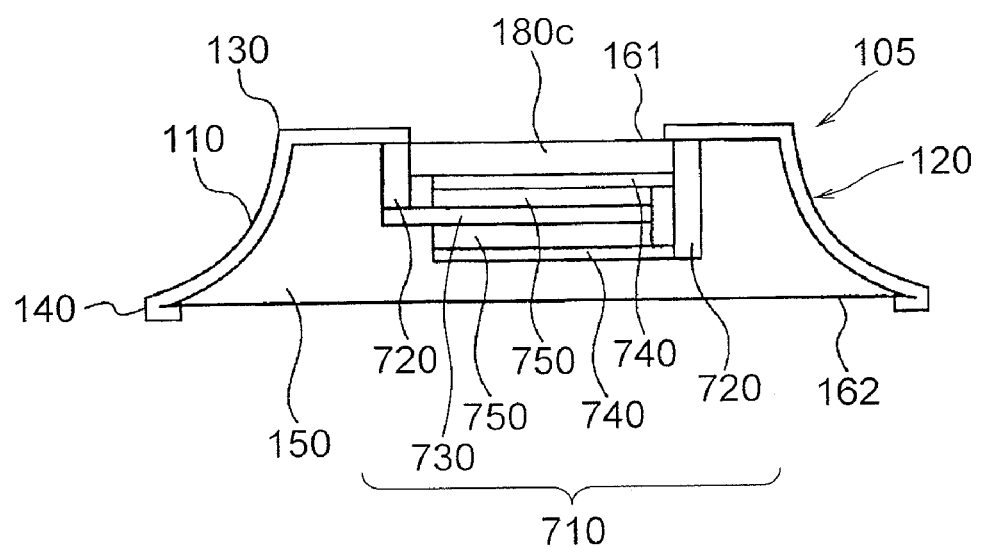
FIG. 57 is a sectional view showing another structure of the spacer according to the sixth exemplary embodiment of the invention.
Figure 58:
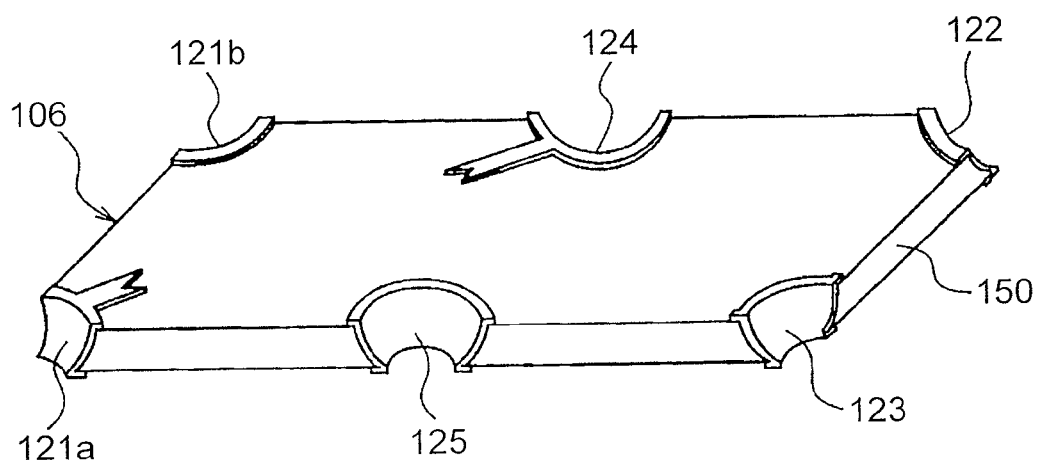
FIG. 58 is a perspective view showing another structure of the spacer according to the sixth exemplary embodiment of the invention.
Figure 59:
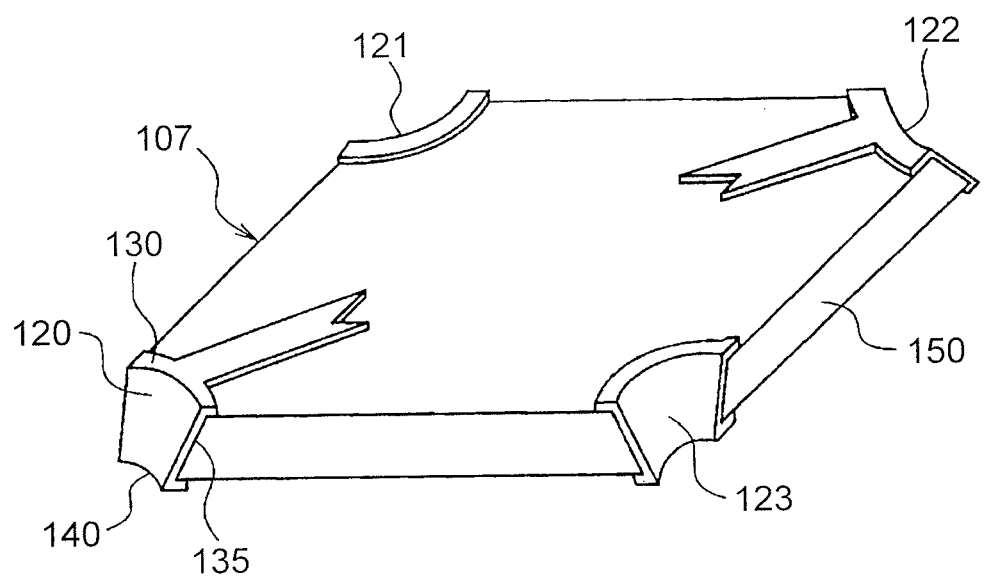
FIG. 59 is a perspective view showing another structure of the spacer according to the sixth exemplary embodiment of the invention.
Figure 60:
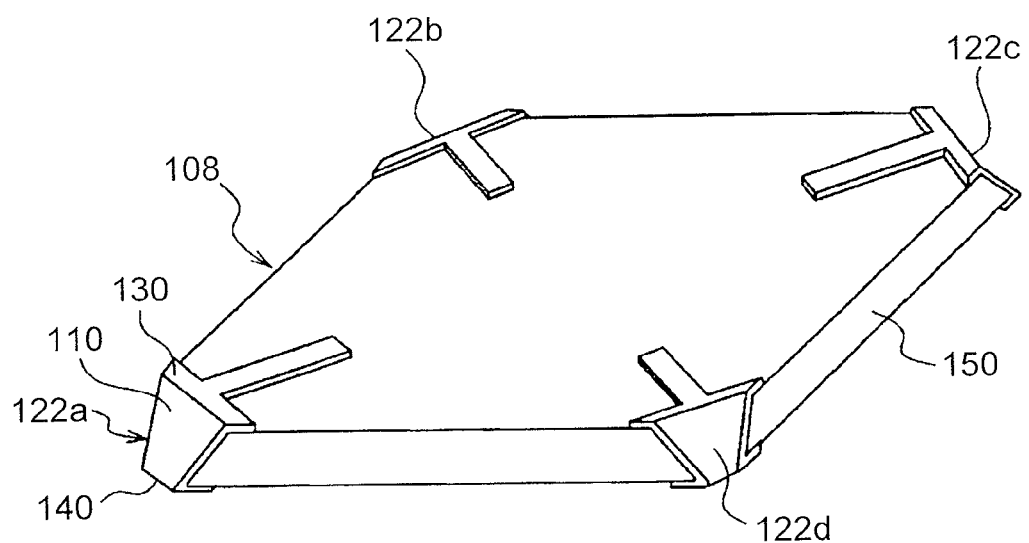
FIG. 60 is a perspective view showing another structure of the spacer according to the sixth exemplary embodiment of the invention.
Figure 61:
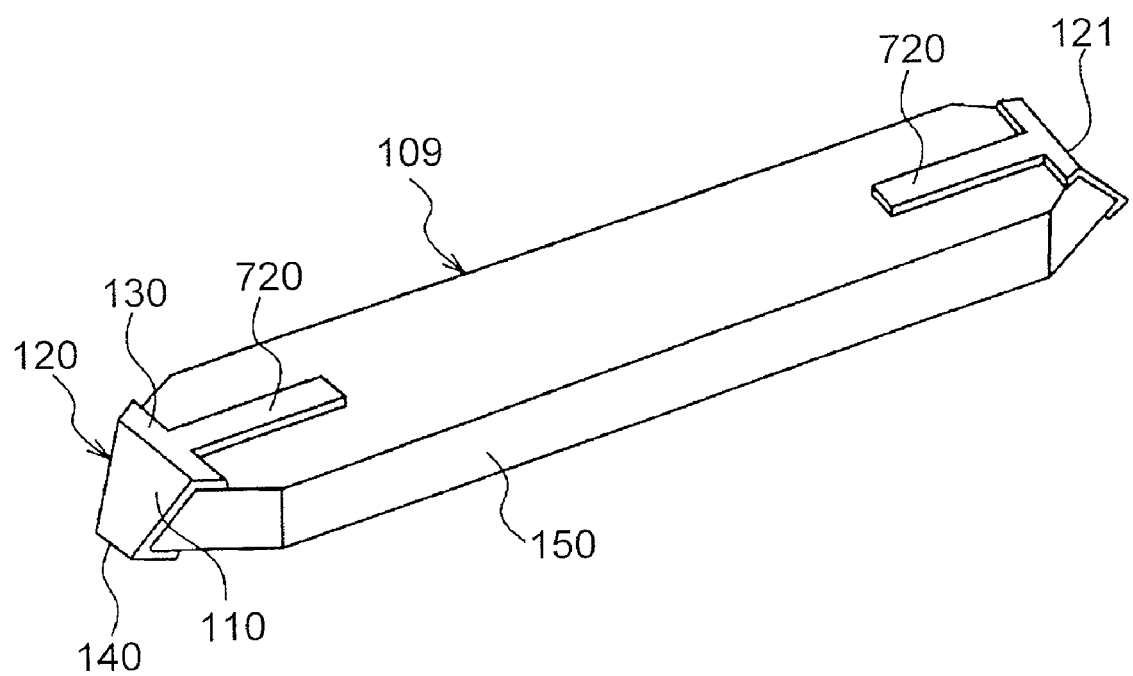
FIG. 61 is a perspective view showing another structure of the spacer according to the sixth exemplary embodiment of the invention.
Figure 62:
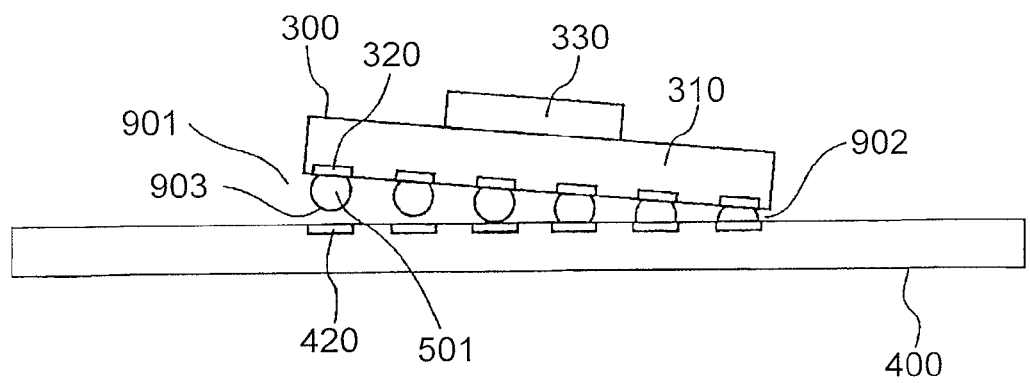
FIG. 62 is a schematic sectional view showing a connection state between an LSI and a target board according to a related technique.
Figure 63A:
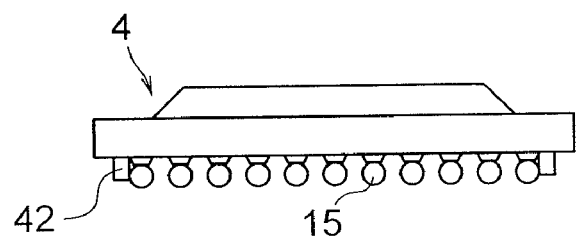
FIGS. 63A-63C shows illustrations of a technique disclosed in Patent Document 1.
Figure 63B:
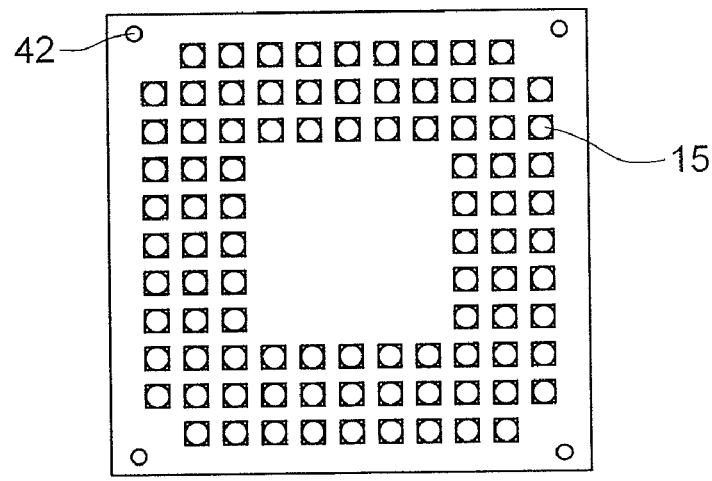
Figure 63C:
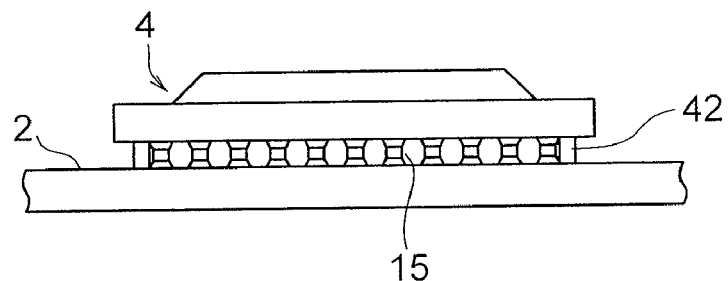
Figure 64A:
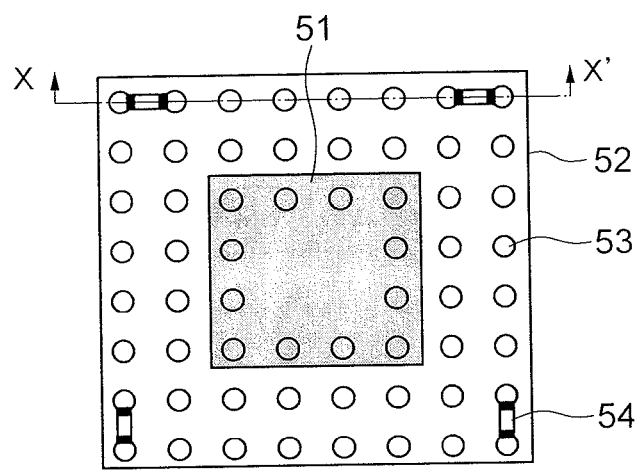
FIGS. 64A and 64B shows illustrations of a technique disclosed in Patent Document 2.
Figure 64B:
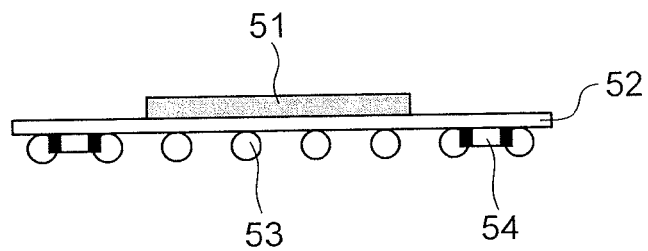
Figure 65A:
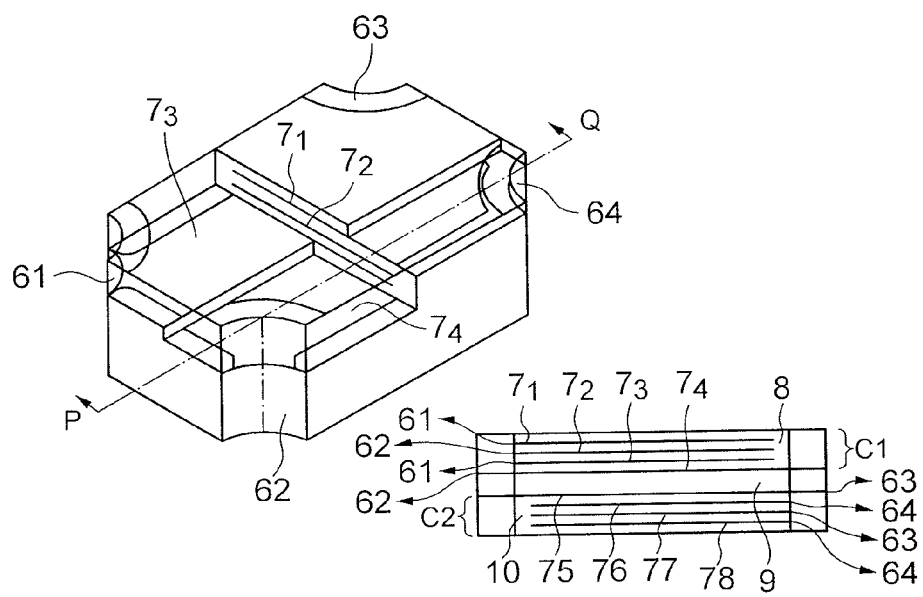
FIGS. 65A and 65B shows illustrations of a technique disclosed in Patent Document 3.
Figure 65B:
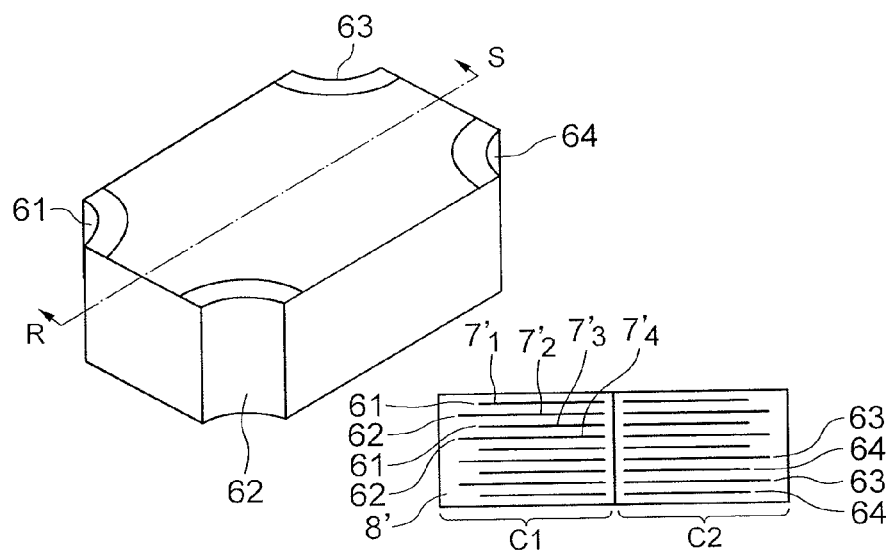
Figure 66:
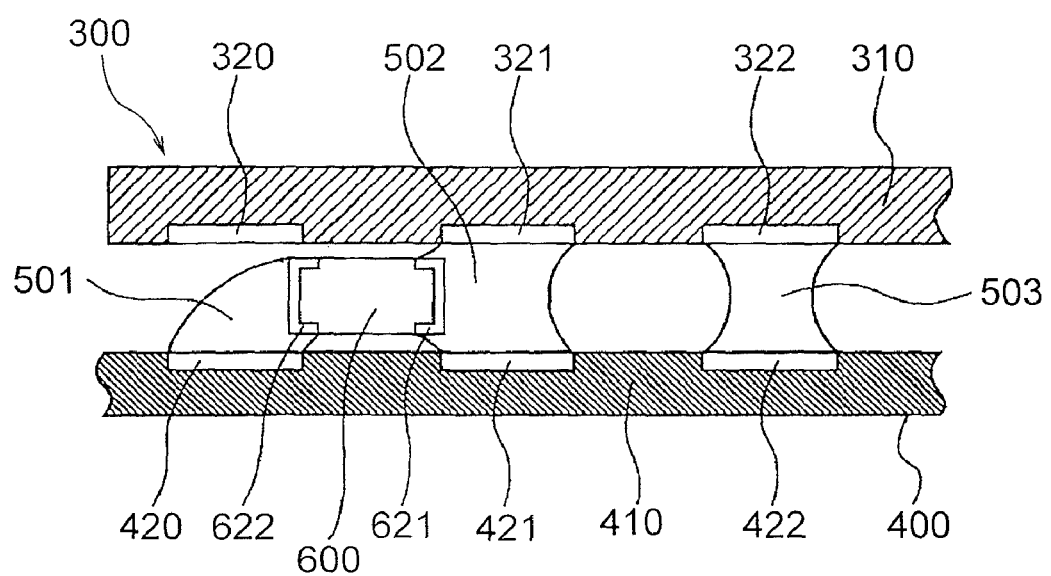
FIG. 66 is a schematic sectional view showing a connection state between an LSI and a target board of a case where the technique disclosed in Patent Document 2 is applied.

100, 101, 102, 103, 104, 105, 106, 107, 108, 109 Spacer
110 Solder guiding face
120, 121, 122, 123, 124, 125, 121a, 121b, 121c, 121d, 122, 122a, 122b, 122c, 122d
Solder guiding terminal
130 Intersection line of solder guiding face and top face
135 Intersection line of solder guiding face and another side face
140 Intersection line of solder guiding face and bottom face
150 Base member
151, 151a-151e, 151aa, 151g-151x Silicon wafer
151f Silicon wafer piece
152, 152a Hole
153 Fringe of hole
154 Metal terminal
161 Top face
162 Bottom face
171, 172, 173, 174, 172a Cutting line
180, 180a Resist
180b Insulating mask
180c Sealing resin
181, 182, 183, 184, 184a Cutting line
185 Cut face
186 Circular-hole preparation opening position
187 Etching hole position
188 Circular-hole preparation opening
189 Etching hole
300 LSI
310 Interposer
311 Interposer pad
320, 321, 322 LSI pad
330 Semiconductor circuit chip
331 Semiconductor chip pad
400 Printed circuit board
401 Slave board
410 PWB resin
420, 421, 422 PWB pad
425 Slave board pad
440 Resist
501, 502, 503 Solder
510, 511 Solder ball
600, 601, 602, 603, 604 Electronic component
621, 622 Electrode terminal
710 Capacitor
720 Leading terminal
730 Electrode terminal A
740 Electrode terminal B
750 Dielectric layer
810 Pointed tool
841 Container
851 Etching solution
853 Chemical conversion solution
891 Variable power supply
892 Anode wiring
893 Cathode wiring
894 Cathode plate
1521 Intersection line of hole inside face and base member top face
1523 Intersection line of hole inside face and base member bottom face
1522 Hole inside face

The invention claimed is:

1. A spacer placed in a clearance to keep width of the clearance between a mounting board and an electronic component when soldering a pad of the mounting board and a pad of the electronic component mounted on the board by using a predetermined amount of solder, the spacer including a solder guiding face for being connected to the solder used for the soldering, wherein the solder guiding face is in a shape in which one end is protruded towards an outer side than the other end.

2. The spacer as claimed in claim 1, wherein an interior angle formed between the solder guiding face and a face of the spacer is an acute angle.

3. The spacer as claimed in claim 1, wherein the solder guiding face is a curved face.

4. The spacer as claimed in claim 1, wherein the solder guiding face is a concave face.

5. The spacer as claimed in claim 1, wherein the solder guiding face is a flat face.

6. The spacer as claimed in claim 1, comprising:
a plurality of terminals that form the solder guiding faces; and
a built-in capacitance element which is connected to the terminals.

7. The spacer as claimed in claim 6, wherein the capacitance element is a solid aluminum electrolytic capacitor.

8. The spacer as claimed in claim 6, wherein the capacitance element is a ceramic capacitor.

9. The spacer as claimed in claim 1, comprising:
a plurality of terminals that form the solder guiding faces; and
a built-in capacitance circuit which is connected to the terminals.

10. A large scale integrated circuit formed by mounting a semiconductor circuit chip having a semiconductor chip pad on its surface onto an interposer having an interposer pad on its surface, wherein:
the interposer pad and the semiconductor chip pad are connected by soldering;
the spacer as claimed in claim 1 is provided in a clearance between the semiconductor circuit chip and the interposer; and
the solder guiding face of the spacer, the interposer pad, and the semiconductor chip pad are connected by soldering.

11. A printed circuit board having a PWB resin part including a PWB pad on its surface, to which a slave board having a slave board pad on its surface is mounted, wherein:
the PWB pad and the slave board pad are connected by soldering;
the spacer as claimed in claim 1 is provided in a clearance at a connecting position of the slave board; and
the solder guiding face of the spacer, the PWB pad, and the slave board pad are connected by soldering.

* * * * *